United States Patent
Kameda et al.

(10) Patent No.: US 12,255,599 B2
(45) Date of Patent: Mar. 18, 2025

(54) PIEZOELECTRIC RESONATOR UNIT AND OSCILLATOR PROVIDED WITH THE SAME

(71) Applicant: Murata Manufacturing Co., Ltd., Nagaokakyo (JP)

(72) Inventors: Eitaro Kameda, Nagaokakyo (JP); Keisuke Takeyama, Nagaokakyo (JP); Toshio Nishimura, Nagaokakyo (JP); Hiroshi Nakatani, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 477 days.

(21) Appl. No.: 17/568,017

(22) Filed: Jan. 4, 2022

(65) Prior Publication Data
US 2022/0123705 A1    Apr. 21, 2022

Related U.S. Application Data

(63) Continuation of application No. PCT/JP2020/010771, filed on Mar. 12, 2020.

(30) Foreign Application Priority Data

Jul. 11, 2019    (JP) ................ 2019-129570

(51) Int. Cl.
*H03H 3/02* (2006.01)
*H03H 9/02* (2006.01)
*H03H 9/56* (2006.01)

(52) U.S. Cl.
CPC .......... *H03H 3/02* (2013.01); *H03H 9/02023* (2013.01); *H03H 9/564* (2013.01)

(58) Field of Classification Search
CPC ...... H03H 3/02; H03H 9/02023; H03H 9/564; H03H 9/02102; H03H 9/0547; H03H 9/1021; H03H 9/08; H03B 5/32
(Continued)

(56) References Cited

U.S. PATENT DOCUMENTS

9,147,831 B2    9/2015    Kuroda et al.
2008/0304544 A1*  12/2008    Kvisteroy ............... G01L 21/00
                                                                         374/143
2013/0082573 A1    4/2013    Kuroda et al.

FOREIGN PATENT DOCUMENTS

JP    2005286658 A    10/2005
JP    2007235388 A    9/2007
(Continued)

OTHER PUBLICATIONS

Machine English Translation of JP2016152607A published on Aug. 22, 2016 (Year: 2016).*

(Continued)

*Primary Examiner* — Jorge L Salazar, Jr.
(74) *Attorney, Agent, or Firm* — ArentFox Schiff LLP

(57) ABSTRACT

A piezoelectric resonator unit that includes a base, a cover, and a laminated structure disposed between the base and the cover. The laminated structure includes a piezoelectric resonator having a piezoelectric layer with a pair of principal surfaces facing each other, and a pair of excitation electrodes disposed on respective surfaces of the pair of principal surfaces so as to face each other with the piezoelectric layer therebetween, a semiconductor layer laminated on a side of one of the pair of principal surfaces of the piezoelectric layer, and a pair of measurement electrodes provided on the semiconductor layer. The pair of measurement electrodes measure signals based on temperature of the piezoelectric resonator through the semiconductor layer.

18 Claims, 15 Drawing Sheets

(58) Field of Classification Search
USPC .................................. 333/186–188, 193–196
See application file for complete search history.

(56) References Cited

FOREIGN PATENT DOCUMENTS

| JP | 2009027477 A | 2/2009 |
| JP | 2013081022 A | 5/2013 |
| JP | 2015170950 A | 9/2015 |
| JP | 2016116054 A | 6/2016 |
| JP | 2016152607 A | 8/2016 |
| JP | 2019068304 A | 4/2019 |

OTHER PUBLICATIONS

International Search Report issued in PCT/JP2020/010771, dated May 26, 2020.
Written Opinion of the International Search Report issued in PCT/JP2020/010771, dated May 26, 2020.

* cited by examiner

PIEZOELECTRIC RESONATOR UNIT AND OSCILLATOR PROVIDED WITH THE SAME

CROSS REFERENCE TO RELATED APPLICATIONS

The present application is a continuation of PCT/JP2020/010771 filed Mar. 12, 2020, which claims priority to Japanese Patent Application No. 2019-129570, filed Jul. 11, 2019, the entire contents of each of which are incorporated herein by reference.

TECHNICAL FIELD

The present invention relates to a piezoelectric resonator unit and an oscillator provided with the piezoelectric resonator unit.

BACKGROUND

Piezoelectric resonator units are used for applications such as timing devices, sensors, and oscillators in various electronic devices such as mobile communication terminals, communication base stations, and home electric appliances. A piezoelectric resonator unit includes a piezoelectric resonator, having a mechanical vibrating portion that converts electric vibration into mechanical vibration by using a piezoelectric effect, and an enclosure that accommodates the piezoelectric resonator. Since the frequency of the piezoelectric resonator changes based on frequency-temperature characteristics, it is necessary to measure temperature of the piezoelectric resonator in order to achieve a high-accuracy tolerance in the piezoelectric resonator unit.

For example, Japanese Unexamined Patent Application Publication No. 2009-027477 ("Patent Document 1") discloses a piezoelectric oscillator that includes a piezoelectric resonator, a base member on which the piezoelectric resonator is mounted, and a cover member that is bonded to the base member and hermetically seals the piezoelectric resonator. Moreover, a circuit pattern and a temperature detection unit are arranged on a surface of the base member or the cover member.

However, in the piezoelectric oscillator described in Patent Document 1, heat conduction is limited due to a space existing between the temperature detection unit and the piezoelectric resonator and hence a gap is generated between the temperature of the piezoelectric resonator and the temperature measured by the temperature detection unit. Since accurate temperature information cannot be acquired as described above, accurate temperature compensation cannot be performed and there is a problem in that frequency accuracy deteriorates.

SUMMARY OF THE INVENTION

Accordingly, an object of the present invention is to provide a piezoelectric resonator unit in which temperature compensation accuracy is improved and also to provide an oscillator with the piezoelectric resonator unit.

In an exemplary aspect, a piezoelectric resonator unit is provided that includes a base member, a cover member, and a laminated structure provided between the base member and the cover member. The laminated structure includes a piezoelectric resonator including a piezoelectric layer having a pair of principal surfaces facing each other and a pair of excitation electrodes each provided on corresponding one of the pair of principal surfaces of the piezoelectric layer so as to face each other with the piezoelectric layer therebetween, a semiconductor layer laminated on a side of one of the pair of principal surfaces of the piezoelectric layer of the piezoelectric resonator, and a pair of measurement electrodes provided on the semiconductor layer. The pair of measurement electrodes is configured to measure a signal based on temperature of the piezoelectric resonator through the semiconductor layer.

According to the exemplary aspect, a piezoelectric resonator unit is provided with improved temperature compensation accuracy. Moreover, an oscillator is provided with the piezoelectric resonator unit.

DETAILED DESCRIPTION OF EMBODIMENTS

Hereinafter, embodiments of the present invention will be described with reference to the accompanying drawings. The drawings of each embodiment are examples, and dimensions and shapes of respective portions are schematic, and the technical scope of the present invention should not be understood as being limited to the embodiments.

In the following description, a quartz crystal resonator unit provided with a quartz crystal resonator will be taken as an example of a piezoelectric resonator unit for description. The quartz crystal resonator uses a quartz crystal element as a piezoelectric body excited by a piezoelectric effect.

It is noted that the piezoelectric element according to the exemplary embodiments is not limited to a quartz crystal element. The piezoelectric element may be formed of any piezoelectric material such as a piezoelectric single crystal, piezoelectric ceramics, a piezoelectric thin film, or a piezoelectric polymer film. For example, the piezoelectric single crystal may include lithium niobate ($LiNbO_3$). Similarly, examples of the piezoelectric ceramics may include barium titanate ($BaTiO_3$), lead titanate ($PbTiO_3$), lead zirconate titanate ($Pb(Zr_xTi_{1-x})O_3$; PZT), aluminum nitride (AlN), lithium niobate ($LiNbO_3$), lithium metaniobate ($LiNb_2O_6$), bismuth titanate ($Bi_4Ti_3O_{12}$), lithium tantalate ($LiTaO_3$), lithium tetraborate ($Li_2B_4O_7$), langasite ($La_3Ga_5SiO_{14}$), and tantalum pentoxide ($Ta_2O_5$). Examples of the piezoelectric thin film may include a film formed by depositing the piezoelectric ceramics on a substrate such as quartz or sapphire by a sputtering method or the like. Examples of the piezoelectric polymer film may include polylactic acid (PLA), polyvinylidene fluoride (PVDF), and a vinylidene fluoride/trifluoroethylene (VDF/TrFE) copolymer. The various piezoelectric materials described above may be laminated on each other or may be laminated on another member as would be appreciated to one skilled in the art.

First Exemplary Embodiment

Figure 1:
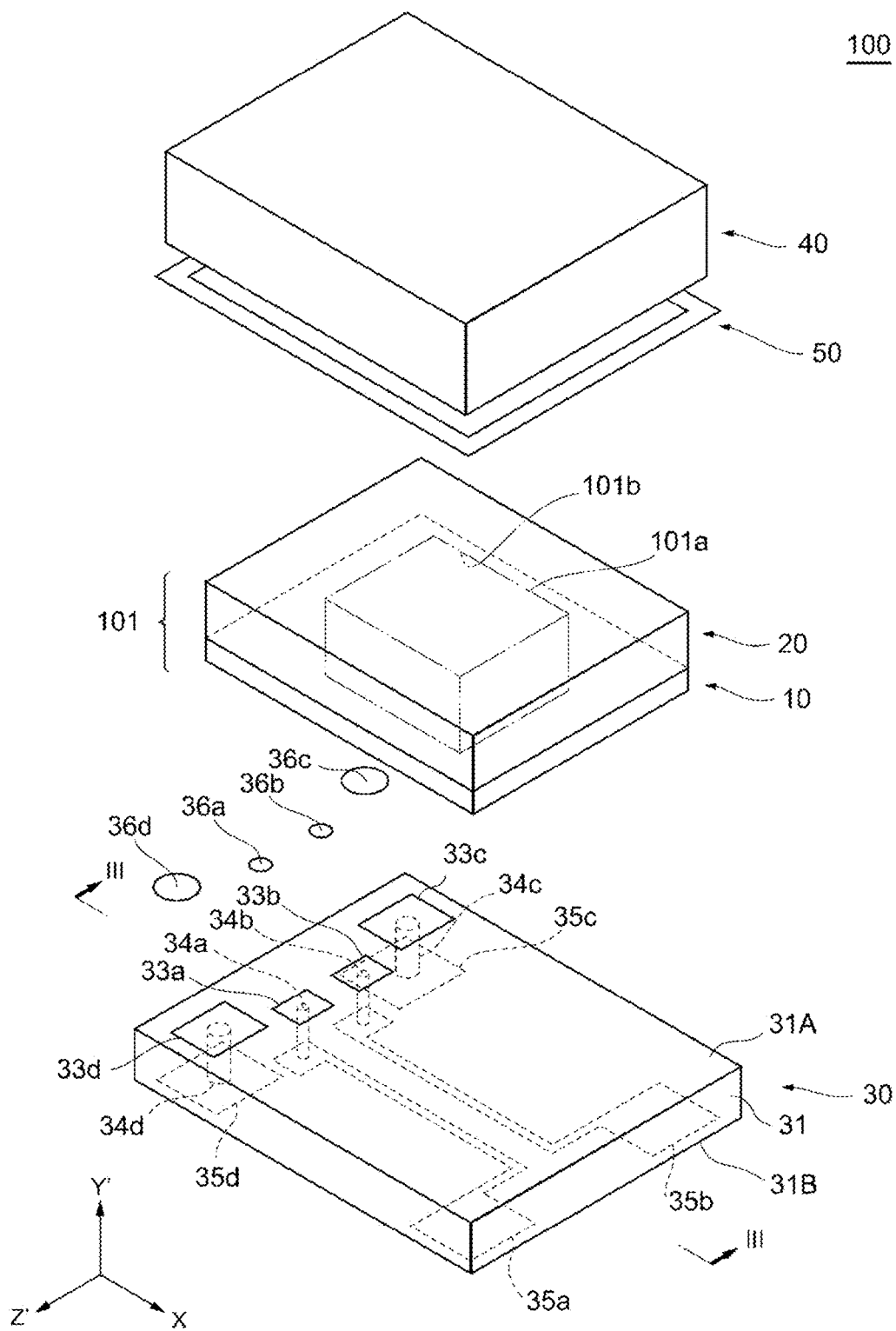
FIG. 1 is a perspective view schematically illustrating a configuration of a quartz crystal resonator unit according to a first exemplary embodiment.
Figure 2:
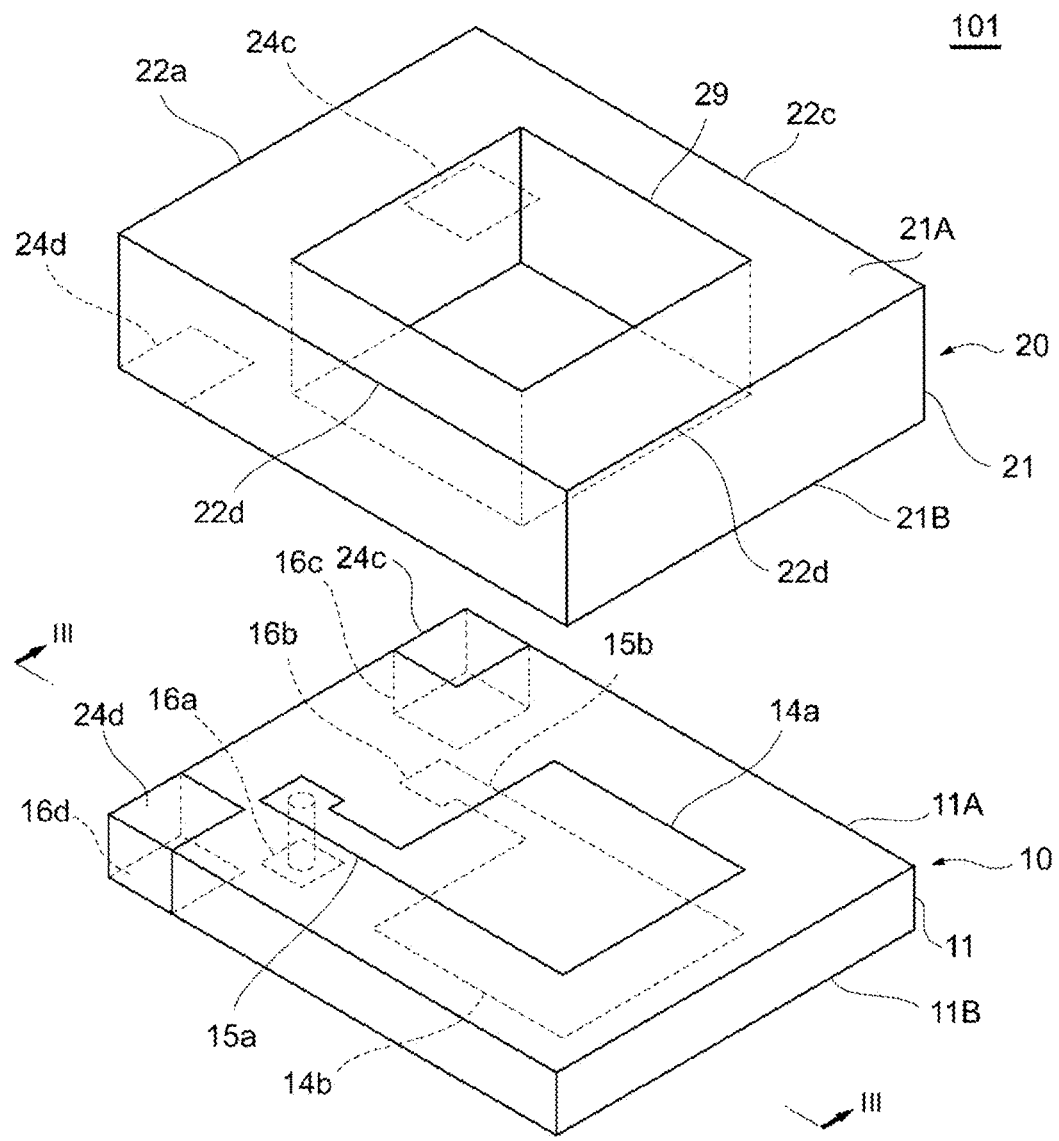
FIG. 2 is a perspective view schematically illustrating a configuration of a laminated structure according to the first exemplary embodiment.
Figure 3:
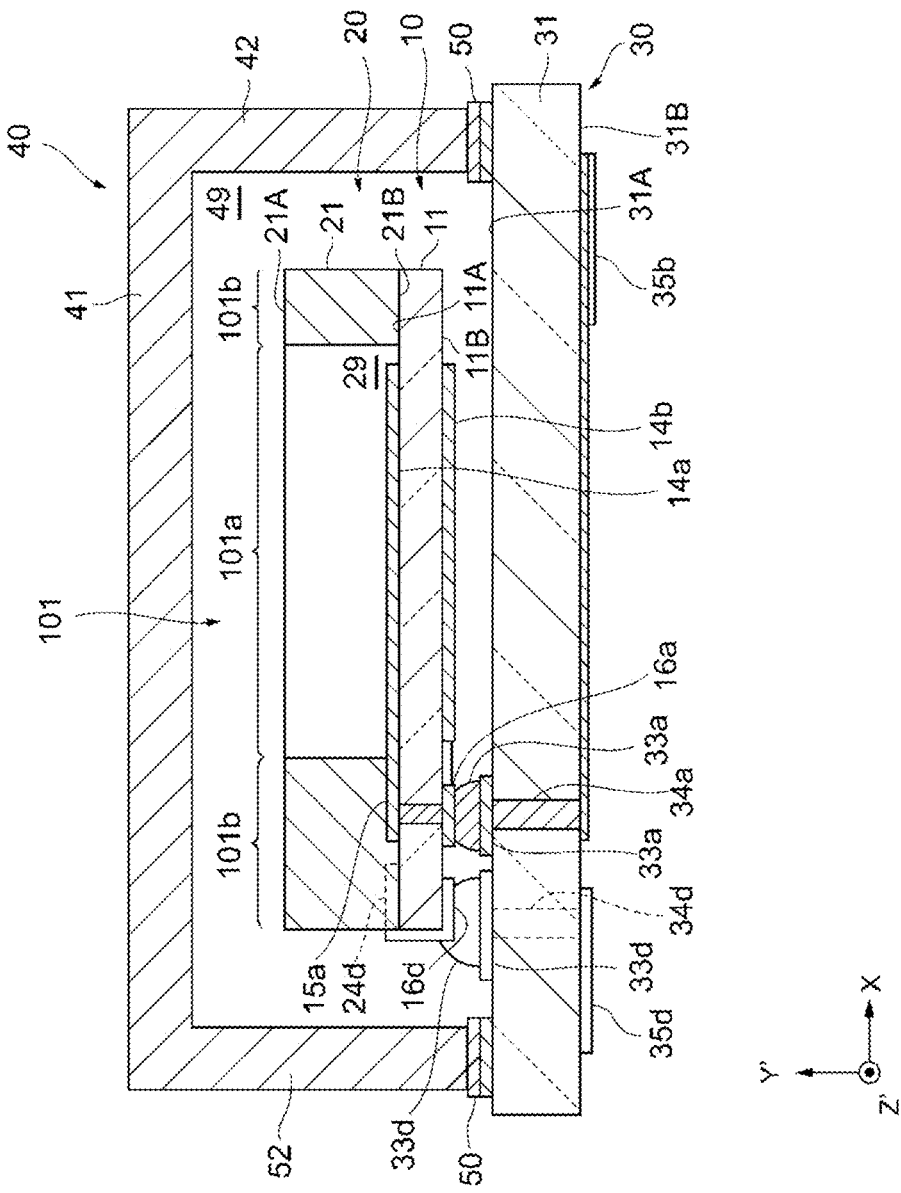
FIG. 3 is a sectional view schematically illustrating the configuration of the quartz crystal resonator unit according to the first exemplary embodiment.

First, a configuration of a quartz crystal resonator unit 100 according to a first exemplary embodiment will be described with reference to FIGS. 1 to 3. FIG. 1 is a perspective view schematically illustrating a configuration of a quartz crystal resonator unit according to the first embodiment. FIG. 2 is a perspective view schematically illustrating a configuration of a laminated structure according to the first embodiment. FIG. 3 is a sectional view schematically illustrating the configuration of the quartz crystal resonator unit according to the first embodiment. The sectional view illustrated in FIG. 3 is taken along line III-III illustrated in FIGS. 1 and 2.

In each of the drawings, an orthogonal coordinate system including the X-axis, the Y'-axis, and the Z'-axis may be illustrated for convenience in order to clarify a relationship between each of the drawings and to help understand a positional relationship between each of the members. The X-axis, the Y'-axis, and the Z'-axis respectively correspond to those in the drawings. The X-axis, the Y'-axis, and the Z'-axis respectively correspond to crystallographic axes of a quartz crystal element 11 to electrical axis (polar axis), the Y-axis corresponds to a mechanical axis, and the Z-axis corresponds to an optical axis be described later, and the X-axis corresponds to a lengthwise direction of the exemplary resonator. The Y'-axis and the Z'-axis are the axes obtained by respectively rotating the Y-axis and the Z-axis around the X-axis in the direction from the Y-axis to the Z-axis by 35 degrees 15 minutes±1 minute 30 seconds. In the following description, a direction parallel to the X-axis is referred to as the "X-axis direction", a direction parallel to the Y'-axis is referred to as the "Y'-axis direction", and a direction parallel to the Z'-axis is referred to as the "Z'-axis direction". In addition, a tip direction of an arrow of the X-axis, the Y'-axis, and the Z'-axis is referred to as "+ (plus)", and a direction opposite to the arrow is referred to as "− (minus)".

As shown, the quartz crystal resonator unit 100 includes a laminated structure 101, a base member 30 (also referred to as a "base"), a bonding member 50, and a cover member 40 (also referred to as a "cover"). The laminated structure 101 is provided between the base member 30 and the cover member 40. In the example illustrated in FIGS. 1 and 2, the laminated structure 101 is mounted on the base member 30. The base member 30 and the cover member 40 form an enclosure for accommodating the laminated structure 101. In the example illustrated in FIGS. 1 and 2, the base member 30 has a flat-plate shape, and the cover member 40 has a bottomed cavity that accommodates the laminated structure 101 on a side of the base member 30. As long as at least a vibrating portion of the laminated structure 101 is accommodated in the enclosure, a method for enclosing the laminated structure 101 and the shapes of the base member 30 and the cover member 40 are not limited to those described above. For example, the base member 30 may have a bottomed cavity that accommodates the laminated structure 101 on a side of the cover member 40. In addition, the base member 30 and the cover member 40 may have a flat-plate shape or a concave shape that opens toward the laminated structure 101 and may sandwich a peripheral portion of the vibrating portion of the laminated structure 101.

The laminated structure 101 includes a quartz crystal resonator 10 and a temperature detection unit 20. The quartz crystal resonator 10 and the temperature detection unit 20 are laminated in the Z-axis direction, and the quartz crystal resonator 10 is provided on a base member 30 side of the temperature detection unit 20. In addition, when viewed in a plan view in the +Y'-axis direction, the laminated structure 101 includes a vibrating portion 101a including a portion of the quartz crystal resonator 10 that is excited and a peripheral portion 101b located at an outer side portion of the vibrating portion 101a. as shown, the peripheral portion 101b is adjacent to the vibrating portion 101a in a direction parallel to the XZ'-plane. It is noted that the lamination order of the laminated structure 101 is not particularly limited, and the temperature detection unit 20 may be provided on a base member 30 side of the quartz crystal resonator 10.

When the laminated structure is viewed from the viewpoint of portions of the respective layers overlapping each other in the laminated structure 101, for example, the entirety of the temperature detection unit 20 faces only part of the quartz crystal resonator 10 in the Y'-axis direction. To be specific, when the laminated structure 101 is viewed in a plan view in the +Y'-axis direction, the quartz crystal resonator 10 and the temperature detection unit 20 do not overlap each other in the vibrating portion 101a and overlap each other in the peripheral portion 101b. In addition, an outer edge portion of the temperature detection unit 20 overlaps an outer edge portion of the quartz crystal resonator 10, except for a through hole 29 to be described later. However, the laminated structure 101 is not limited to the above described configuration. For example, the entirety of the quartz crystal resonator 10 may face only part of the temperature detection unit 20 in the Y'-axis direction. That is, when viewed in the plan view in the +Y'-axis direction, the quartz crystal resonator 10 may be located inside the temperature detection unit 20. In addition, the entirety of the quartz crystal resonator 10 and the entirety of the temperature detection unit 20 may face each other in the Y'-axis direction, or part of the quartz crystal resonator 10 and part of the temperature detection unit 20 may face each other in the Y'-axis direction.

First, the quartz crystal resonator 10 will be described.

The quartz crystal resonator 10 is an element that vibrates a quartz crystal by a piezoelectric effect and converts electrical energy into mechanical energy. As illustrated in FIG. 2, the quartz crystal resonator 10 includes a quartz crystal element 11 which is thin, a first excitation electrode 14a and a second excitation electrode 14b forming a pair of excitation electrodes, a first extended electrode 15a and a second extended electrode 15b forming a pair of extended electrodes, and a first connection electrode 16a and a second connection electrode 16b forming a pair of connection electrodes. The quartz crystal resonator 10 further includes a third connection electrode 16c and a fourth connection electrode 16d forming a pair of connection electrodes. When viewed in a plan view in the +Y'-axis direction, the shape of the quartz crystal resonator 10 is, for example, a rectangular shape. However, the shape of the quartz crystal resonator 10 is not limited to the above and may be a circular shape, an elliptical shape, a polygonal shape, or a combination thereof in alternative aspects.

The quartz crystal element 11 has an upper surface 11A and a lower surface 11B opposed to each other. The upper surface 11A is located on a side opposite to a side facing the base member 30, that is, on the side facing a top surface portion 41 of the cover member 40 to be described later. The lower surface 11B is located on the side facing the base member 30. The quartz crystal element 11 corresponds to a piezoelectric layer, and the upper surface 11A and the lower surface 11B correspond to a pair of principal surfaces of the piezoelectric layer.

The quartz crystal element 11 is, for example, an AT-cut quartz crystal element. The AT-cut quartz crystal element 11 is formed such that, in an orthogonal coordinate system including the X-axis, the Y'-axis, and the Z'-axis intersecting with each other, a surface parallel to the plane specified by the X-axis and the Z'-axis (hereinafter referred to as an "XZ' surface"; the same applies to surfaces specified by other axes) is a principal surface and a direction parallel to the Y'-axis is a thickness. For example, the AT-cut quartz crystal element 11 is formed by etching a quartz crystal substrate (for example, a quartz crystal wafer) obtained by cutting and polishing a crystal substance of synthetic quartz crystal. The processing method of the quartz crystal substrate is not limited to etching and may be processing using a dicer, a water jet, a laser, or the like.

The quartz crystal resonator 10 using the AT-cut quartz crystal element 11 has high frequency stability in a wide temperature range. In the AT-cut quartz crystal resonator 10, a thickness shear vibration mode is used as main vibration in operation. The rotation angles of the Y'-axis and the Z'-axis in the AT-cut quartz crystal element 11 may be inclined in a range of not less than −5 degrees and not more than 15 degrees from 35 degrees and 15 minutes. As the cut-angles of the quartz crystal element 11, a different cut other than the AT-cut may be applied. For example, a BT-cut, a GT-cut, an SC-cut, or the like may be applied. The quartz crystal resonator may be a tuning-fork type quartz crystal resonator using a quartz crystal element having a cut-angle referred to as a Z plate.

Moreover, the AT-cut quartz crystal element 11 has a plate shape having a long-side direction in which long sides parallel to the X-axis direction extend, a short-side direction in which short sides parallel to the Z'-axis direction extend, and a thickness direction in which a thickness parallel to the Y'-axis direction extends. The quartz crystal element 11 has a rectangular shape when the upper surface 11A is viewed in a plan view and has a flat-plate shape with a uniform thickness.

It is noted that the planar shape of the quartz crystal element 11 when the upper surface 11A is viewed in the plan view is not limited to a rectangular shape. The planar shape of the quartz crystal element 11 may be a polygonal shape, a circular shape, an elliptical shape, or a combination thereof. In addition, the planar shape of the quartz crystal element 11 may be a tuning-fork shape having a base portion and vibrating arm portions extending in parallel from the base portion. A slit may be formed in the quartz crystal element 11 for the purpose of suppressing vibration leakage or stress transmission.

The shape of the quartz crystal element 11 is not limited to a flat-plate shape having a uniform thickness. For the purpose of suppressing vibration leakage or stress transmission, the quartz crystal element 11 in the vibrating portion 101a may be thicker or thinner than the quartz crystal element 11 in the peripheral portion 101b. In other words, the quartz crystal element 11 may have a mesa structure or an inverted mesa structure. In this case, the boundary between the vibrating portion 101a and the peripheral portion 101b of the quartz crystal element 11 may form, for example, a tapered shape in which the thickness of the quartz crystal element 11 is continuously changed or may form a stepwise shape in which the thickness is discontinuously changed. The quartz crystal element 11 may have a convex structure or a beveled structure in which the amount of change in the thicknesses at the boundary between the vibrating portion 101a and the peripheral portion 101b changes continuously. The mesa structure or the inverted mesa structure may be provided on only one of the upper surface 11A and the lower surface 11B of the quartz crystal element 11 or may be provided on both the surfaces thereof.

As further shown, the first excitation electrode 14a and the second excitation electrode 14b are provided in the vibrating portion 101a. The first excitation electrode 14a is provided on an upper surface 11A side of the quartz crystal element 11, and the second excitation electrode 14b is provided on a lower surface 11B side of the quartz crystal element 11. In other words, the first excitation electrode 14a is provided on a cover member 40 side of the principal surface of the quartz crystal element 11, and the second excitation electrode 14b is provided on a base member 30 side of the principal surface of the quartz crystal element 11. The first excitation electrode 14a and the second excitation electrode 14b face each other with the quartz crystal element 11 therebetween. When the upper surface 11A of the quartz crystal element 11 is viewed in the plan view, the first excitation electrode 14a and the second excitation electrode 14b each have a rectangular shape and are arranged so as to overlap each other substantially entirely. Each of the first excitation electrode 14a and the second excitation electrode 14b has a long side parallel to the X-axis direction, a short side parallel to the Z'-axis direction, and a thickness parallel to the Y'-axis direction. When the laminated structure 101 is viewed in the plan view in the +Y'-axis direction, the first excitation electrode 14a and the second excitation electrode 14b are provided inside the through hole 29 formed in the semiconductor layer 21 to be described later.

It is noted that the planar shape of the first excitation electrode 14a and the second excitation electrode 14b when the upper surface 11A of the quartz crystal element 11 is viewed in the plan view is not limited to a rectangular shape. The planar shape of the first excitation electrode 14a and the second excitation electrode 14b may be a polygonal shape, a circular shape, an elliptical shape, or a combination thereof.

The first extended electrode 15a is provided on the upper surface 11A side of the quartz crystal element 11, and the second extended electrode 15b is provided on the lower surface 11B side of the quartz crystal element 11. The first extended electrode 15a electrically connects the first excitation electrode 14a and the first connection electrode 16a. The second extended electrode 15b electrically connects the second excitation electrode 14b and the second connection electrode 16b. To be specific, as illustrated in FIGS. 2 and 3, the first extended electrode 15a extends along the X-axis direction, one end of the first extended electrode 15a is connected to the first excitation electrode 14a in the vibrating portion 101a, and the other end is connected to a through electrode connected to the first connection electrode 16a in the peripheral portion 101b. The second extended electrode 15b extends along the X-axis direction, one end of the second extended electrode 15b is connected to the second excitation electrode 14b in the vibrating portion 101a, and the other end is electrically connected to the second connection electrode 16b in the peripheral portion 101b. From the viewpoint of reducing stray capacitance, the first extended electrode 15a and the second extended electrode 15b are separated from each other when the upper surface 11A of the quartz crystal element 11 is viewed in the plan view, and the first extended electrode 15a is provided in the +Z'-axis direction with respect to the second extended electrode 15b.

Note that a method for electrical connection between the first extended electrode 15a and the first connection electrode 16a is not limited to connection using the through electrode penetrating the quartz crystal element 11 along the Y'-axis direction. The first extended electrode 15a and the first connection electrode 16a may be connected to each other using, for example, a side surface electrode provided on a side surface connecting the upper surface 11A and the lower surface 11B of the quartz crystal element 11 in an alternative aspect.

Moreover, the first connection electrode 16a and the second connection electrode 16b are electrodes for electrically connecting the first excitation electrode 14a and the second excitation electrode 14b to the base member 30, respectively, and are provided on the lower surface 11B side of the quartz crystal element 11 in the peripheral portion 101b. As illustrated in FIG. 2, the first connection electrode 16a and the second connection electrode 16b are provided at an end portion on the −X-axis direction side with respect to the first excitation electrode 14a and the second excitation electrode 14b, and the first connection electrode 16a is provided in the +Z'-axis direction with respect to the second connection electrode 16b.

The third connection electrode 16c and the fourth connection electrode 16d are electrodes for electrically connecting a first measurement electrode 24c and a second measurement electrode 24d, which will be described later, to the base member 30, respectively, and are provided on the lower surface 11B side of the quartz crystal element 11 in the peripheral portion 101b. In the example illustrated in FIG. 2, the third connection electrode 16c and the fourth connection electrode 16d are provided at corner portions on the −X-axis direction side with respect to the first excitation electrode 14a and the second excitation electrode 14b, respectively. The fourth connection electrode 16d is provided in the +Z'-axis direction with respect to the first connection electrode 16a, and the third connection electrode 16c is provided in the −Z'-axis direction with respect to the second connection electrode 16b.

The first excitation electrode 14a and the second excitation electrode 14b, the first extended electrode 15a and the second extended electrode 15b, and the first connection electrode 16a to the fourth connection electrode 16d are provided by laminating, for example, chromium (Cr) and gold (Au) in this order. It is noted that chromium is superior to gold in adhesion to the quartz crystal element 11, and gold is superior to chromium in chemical stability. For this reason, in a case where the electrodes of the quartz crystal resonator 10 have a multilayer structure formed of chromium and gold, peeling and oxidation of the electrodes can be suppressed, and the quartz crystal resonator 10 with high reliability can be provided. It is also noted that the material forming the electrode of the quartz crystal resonator 10 is not limited to Cr and Au, and the electrode may contain a metal material, such as Ti, Mo, Al, Ni, Pd, Ag, or Cu. The electrode may contain conductive ceramics, a conductive resin, or the like.

Next, the temperature detection unit 20 will be described.

The temperature detection unit 20 includes a semiconductor layer 21 laminated on the quartz crystal resonator 10, and the first measurement electrode 24c and the second measurement electrode 24d forming a pair of measurement electrodes. The temperature detection unit 20 is provided in the peripheral portion 101b so as to avoid the vibrating portion 101a and has a frame shape continuous in the circumferential direction so as to surround the vibrating portion 101a. When viewed in the plan view in the +Y'-axis direction, the shape of the outer edge portion of the temperature detection unit 20 is, for example, a rectangular shape, and is substantially the same as (i.e., congruent with) the shape of the quartz crystal resonator 10. However, the shape of the outer edge portion of the temperature detection unit 20 is not limited to a rectangular shape and may be a circular shape, an elliptical shape, a polygonal shape, or a combination thereof. In addition, the shape of the outer edge portion of the temperature detection unit 20 is not limited to a shape congruent with the shape of the quartz crystal resonator 10 and may be a shape similar to the shape of the quartz crystal resonator 10 or may be different from the shape of the quartz crystal resonator 10.

According to the exemplary aspect, the semiconductor layer 21 is configured to provide a conductive path between the first measurement electrode 24c and the second measurement electrode 24d and to function as a resistance element whose resistance value changes according to the temperature. Since the semiconductor layer 21 is laminated on the quartz crystal resonator 10, the semiconductor layer 21 and the quartz crystal resonator 10 are in a thermal equilibrium state. Therefore, the first measurement electrode 24c and the second measurement electrode 24d measure the resistance value of the semiconductor layer 21 that changes based on the temperature of the quartz crystal resonator 10.

The first measurement electrode 24c and the second measurement electrode 24d are not limited to those described above as long as signals based on the temperature of the quartz crystal resonator 10 can be measured through the semiconductor layer 21. In alternative aspects, the first measurement electrode 24c and the second measurement electrode 24d can be configured to measure inductance or capacitance, for example.

The semiconductor layer 21 includes an upper surface 21A and a lower surface 21B opposed to each other. The upper surface 21A is located on a side facing the top surface portion 41 of the cover member 40 to be described later. The lower surface 21B is located on a side facing the base member 30, that is, the side facing the quartz crystal resonator 10. The upper surface 21A and the lower surface 21B correspond to a pair of principal surfaces of the semiconductor layer 21.

When the upper surface 21A of the semiconductor layer 21 is viewed in the plan view, the semiconductor layer 21 includes a front end portion 22a, a rear end portion 22b, a right end portion 22c, and a left end portion 22d. The front end portion 22a and the rear end portion 22b correspond to a pair of short sides facing each other in the X-axis direction and extending along the Z'-axis direction. The right end portion 22c and the left end portion 22d correspond to a pair of long sides facing each other in the Z'-axis direction and extending along the X-axis direction. That is, both ends of the front end portion 22a are connected to respective one ends of the right end portion 22c and the left end portion 22d, and both ends of the rear end portion 22b are connected to the respective other ends of the right end portion 22c and the left end portion 22d. The front end portion 22a is located on the side of the first connection electrode 16a and the second connection electrode 16b with respect to the first excitation electrode 14a and the second excitation electrode 14b. The rear end portion 22b is located on the +X-axis direction side with respect to the front end portion 22a, and the left end portion 22d is located on the +Z'-axis direction side with respect to the right end portion 22c.

As further shown, a through hole 29 is formed in the semiconductor layer 21 so as to open to both the upper surface 21A and the lower surface 21B. The through hole 29 is formed in the vibrating portion 101a. The semiconductor layer 21 is provided so as to avoid the vibrating portion 101a and to not be in contact with the first excitation electrode 14a and the second excitation electrode 14b. The semiconductor layer 21 is provided so as to be in contact with the quartz crystal resonator 10 over the substantially entirety of peripheral portion 101b and has a rectangular frame shape along the front end portion 22a, the rear end portion 22b, the right end portion 22c, and the left end portion 22d.

The semiconductor layer 21 includes a semiconductor having low electrical conductivity so that the first excitation electrode 14a is sufficiently insulated/isolated from the first measurement electrode 24c and the second measurement electrode 24d. For example, the semiconductor layer 21 is an i-type or a nondegenerate low-concentration n-type or p-type silicon semiconductor. However, the semiconductor layer 21 is not limited to the above and may be a single element semiconductor such as germanium, a compound semiconductor such as gallium arsenide, or an organic semiconductor such as pentacene.

In the exemplary aspect, the first measurement electrode 24c and the second measurement electrode 24d are provided on the lower surface 21B of the semiconductor layer 21 and are sandwiched between the quartz crystal element 11 and the semiconductor layer 21. The first measurement electrode 24c and the second measurement electrode 24d are provided at an end portion on the same side as the first connection electrode 16a and the second connection electrode 16b with respect to the first excitation electrode 14a and the second excitation electrode 14b. In addition, the first measurement electrode 24c and the second measurement electrode 24d are farther away from the first excitation electrode 14a and the second excitation electrode 14b than the first connection electrode 16a and the second connection electrode 16b are. The laminated structure 101 has a so-called cantilever structure in which a side of one end portion (e.g., a portion corresponding to the front end portion 22a of the semiconductor layer 21) of the end portions on the +X-axis direction side and the −X-axis direction side with respect to the first excitation electrode 14a and the second excitation electrode 14b is bonded to the base member 30 and a side of the other end portion (e.g., a portion corresponding to the rear end portion 22b of the semiconductor layer 21) is separated from the base member 30. The first measurement electrode 24c is provided at a corner formed by the front end portion 22a and the right end portion 22c, and the second measurement electrode 24d is provided at a corner formed by the front end portion 22a and the left end portion 22d. The first measurement electrode 24c and the second measurement electrode 24d are electrically connected to the third connection electrode 16c and the fourth connection electrode 16d, respectively, by side surface electrodes provided on the side surfaces of the quartz crystal element 11.

It is noted that the first measurement electrode 24c and the second measurement electrode 24d can be provided on the upper surface 21A of the semiconductor layer 21 or can be provided on a side surface connecting the upper surface 21A and the lower surface 21B of the semiconductor layer 21. When the upper surface 21A of the semiconductor layer 21 is viewed in the plan view, the first measurement electrode 24c and the second measurement electrode 24d may be provided on the side opposite to the first connection electrode 16a and the second connection electrode 16b with respect to the first excitation electrode 14a and the second excitation electrode 14b. That is, the laminated structure 101 may have a so-called double-supported structure in which the both sides of the one end portion and the other end portion described above with respect to the first excitation electrode 14a and the second excitation electrode 14b are bonded to the base member 30. In addition, the first measurement electrode 24c and the second measurement electrode 24d may be electrically connected to the third connection electrode 16c and the fourth connection electrode 16d, respectively, by a through electrode.

Next, the base member 30 will be described.

In the exemplary aspect, the base member 30 holds the quartz crystal resonator 10 such that the quartz crystal resonator 10 can be excited. The base member 30 includes a base body 31 having an upper surface 31A and a lower surface 31B facing each other. The upper surface 31A is located on a side of the laminated structure 101 and the cover member 40 and corresponds to a mounting surface on which the laminated structure 101 is mounted. The lower surface 31B corresponds to, for example, a mounting surface bonded to an external circuit board (not illustrated). The base body 31 is formed of a sintered material such as insulating ceramics (alumina), for example. From the viewpoint of suppressing generation of thermal stress, the base body 31 is preferably formed of a heat resistant material. From the viewpoint of suppressing the stress applied to the quartz crystal resonator 10 due to thermal history, the base body 31 may be formed of a material having a thermal expansion coefficient close to that of the quartz crystal element 11 and, for example, may be formed of quartz crystal.

As further shown in FIG. 1, the base member 30 includes a first electrode pad 33a and a second electrode pad 33b forming a pair of electrode pads, and a third electrode pad 33c and a fourth electrode pad 33d forming a pair of electrode pads. The first electrode pad 33a to the fourth electrode pad 33d are provided on the upper surface 31A of the base body 31. The first electrode pad 33a and the second electrode pad 33b are terminals for electrically connecting the quartz crystal resonator 10 to the base member 30, and the third electrode pad 33c and the fourth electrode pad 33d are terminals for electrically connecting the temperature detection unit 20 to the base member 30. The first electrode pad 33a to the fourth electrode pad 33d are arranged along the Z'-axis direction at an end portion on the −X-axis direction side of the base member 30.

The base member 30 includes a first outer electrode 35a, a second outer electrode 35b, a third outer electrode 35c, and a fourth outer electrode 35d. The first outer electrode 35a to the fourth outer electrode 35d are provided on the lower surface 31B of the base body 31. The first outer electrode 35a and the second outer electrode 35b are terminals for electrically connecting an external circuit board (not illustrated) and the quartz crystal resonator unit 100. The third outer electrode 35c and the fourth outer electrode 35d are terminals for electrically connecting an external circuit board (not illustrated) and the temperature detection unit 20.

Moreover, the first outer electrode 35a and the second outer electrode 35b are arranged along the Z'-axis direction at an end portion on the +X-axis direction side of the base member 30. The third outer electrode 35c and the fourth outer electrode 35d are arranged along the Z'-axis direction at an end portion on the −X-axis direction side of the base member 30. The first electrode pad 33a is electrically connected to the first outer electrode 35a via a first through electrode 34a penetrating the base body 31 and base wiring provided on the lower surface 31B of the base body 31. The second electrode pad 33b is electrically connected to the second outer electrode 35b via a second through electrode 34b penetrating the base body 31 along the Y'-axis direction and base wiring provided on the lower surface 31B of the base body 31. The third electrode pad 33c and the fourth electrode pad 33d are electrically connected to the third outer electrode 35c and the fourth outer electrode 35d via a third through electrode 34c and a fourth through electrode 34d penetrating the base body 31, respectively.

The first electrode pad 33a and the second electrode pad 33b can be electrically connected to the first outer electrode 35a and the second outer electrode 35b, respectively, via base wiring provided on the upper surface 31A of the base body 31. The first electrode pad 33a to the fourth electrode pad 33d can be electrically connected to the first outer electrode 35a to the fourth outer electrode 35d, respectively, via a side surface electrode provided on a side surface connecting the upper surface 31A and the lower surface 31B of the base body 31. The first outer electrode 35a to the fourth outer electrode 35d may be a castellation electrode provided in a concave shape on a side surface of the base body 31.

The base member 30 includes a first conductive holding member 36a and a second conductive holding member 36b that form a pair of conductive holding members, and a third conductive holding member 36c and a fourth conductive holding member 36d that form a pair of conductive holding members. The first conductive holding member 36a to the fourth conductive holding member 36d of the base member 30 mount the laminated structure 101 and electrically connect the laminated structure 101 and the base member 30. The first conductive holding member 36a bonds and electrically connects the first electrode pad 33a and the first connection electrode 16a. The second conductive holding member 36b bonds and electrically connects the second electrode pad 33b and the second connection electrode 16b. The third conductive holding member 36c bonds and electrically connects the third electrode pad 33c and the third connection electrode 16c. The fourth conductive holding member 36d bonds and electrically connects the fourth electrode pad 33d and the fourth connection electrode 16d. The first conductive holding member 36a to the fourth conductive holding member 36d hold the laminated structure 101 spaced from the base member 30 so that the vibrating portion 101a can be excited.

The first conductive holding member 36a to the fourth conductive holding member 36d are, for example, conductive adhesives including thermosetting resins, ultraviolet curing resins, and the like, having silicone-based resins as a base material and include additives such as conductive particles for imparting conductivity to the adhesives. As the conductive particles, for example, conductive particles containing silver (Ag) are used. The base material of the conductive adhesive may be an epoxy resin, an acrylic resin, or the like. The first conductive holding member 36a to the fourth conductive holding member 36d are provided by applying an uncured conductive adhesive paste which is a precursor and then curing the conductive adhesive paste through chemical reactions caused by heating, ultraviolet irradiation, or the like. Moreover, a filler can be added to the adhesive of the first conductive holding member 36a to the fourth conductive holding member 36d for the purpose of increasing the strength or for the purpose of maintaining the distance between the base member 30 and the quartz crystal resonator 10. It is noted that the first conductive holding member 36a to the fourth conductive holding member 36d may be formed by solder.

Next, the cover member 40 will be described.

The cover member 40 is bonded to the base member 30 and forms an internal space 49 in which the laminated structure 101 is accommodated between the cover member 40 and the base member 30. Although the shape of the cover member 40 is not particularly limited as long as the cover member 40 can accommodate at least the vibrating portion 101a of the laminated structure 101 and the material of the cover member 40 is not particularly limited, the cover member is formed of a conductive material such as metal, for example. Since the cover member 40 is formed of a conductive material, an electromagnetic shielding function that reduces entering and leaving of electromagnetic waves to and from the internal space 49 is imparted to the cover member 40.

The cover member 40 includes the top surface portion 41 having a flat-plate shape and a side wall portion 42 connected to an outer edge of the top surface portion 41 and extending in a direction intersecting a principal surface of the top surface portion 41. The planar shape of the top surface portion 41 when viewed in the plan view in the direction normal to the principal surface is, for example, a rectangular shape. The tip end of the side wall portion 42 extends in a frame shape so as to surround the periphery of the laminated structure 101.

Moreover, the cover member 40 can be bonded to an outer edge portion of the laminated structure 101 to form the internal space 49. At this time, the outer edge portion of the laminated structure 101 can be sandwiched between the base member 30 and the cover member 40. Further, the cover member 40 may be formed of a ceramic material, a semiconductor material, a resin material, or the like, for example. In addition, the planar shape of the top surface portion 41 may be a polygonal shape, a circular shape, an elliptical shape, or a combination thereof.

Next, the bonding member 50 will be described.

The bonding member 50 is provided over the entire circumference of each of the base member 30 and the cover member 40 and has a rectangular frame shape. In addition, the first electrode pad 33a to the fourth electrode pad 33d are arranged inside the bonding member 50, and the bonding member 50 is provided so as to surround the laminated structure 101. The bonding member 50 bonds the tip end of the side wall portion 22 of the cover member 40 and the upper surface 31A of the base body 31 of the base member 30. Moreover, the bonding member 50 is formed of, for example, a metallized layer provided on the upper surface 31A of the base body 31 and an Au—Sn alloy-based metallic solder provided on the metallized layer.

It is also noted that the bonding member 50 is not limited to a frame shape that is continuous in the circumferential direction and may be provided discontinuously in the circumferential direction in an alternative aspect. Further, the bonding member 50 may be formed of a resin-based or glass-based insulating adhesive or the like.

Next, an operation of the quartz crystal resonator unit 100 will be described.

The quartz crystal resonator unit 100 has a temperature detection mode for measuring the temperature of the quartz crystal resonator 10 and a signal output mode for driving the quartz crystal resonator 10 by performing temperature compensation based on the measurement result in the temperature detection mode.

In the temperature detection mode, for example, by applying a current to the semiconductor layer 21 between the first measurement electrode 24c and the second measurement electrode 24d, and the resistance value of the semiconductor layer 21 is measured. Although the resistance value of the semiconductor layer 21 changes depending on the temperature of the semiconductor layer 21, the temperature of the semiconductor layer 21 becomes substantially the same as the temperature of the quartz crystal resonator 10 due to thermal conduction between the semiconductor layer 21 and the quartz crystal resonator 10. Therefore, in the temperature detection mode, the temperature of the quartz crystal resonator 10 is measured by measuring a change of the resistance value of the semiconductor layer 21.

In the signal output mode, a frequency of an oscillation circuit based on the quartz crystal resonator 10 is corrected by temperature compensation based on the measurement result in the temperature detection mode. The temperature compensation is achieved, for example, by changing a signal to a variable capacitor for correcting the frequency.

As described above, the quartz crystal resonator unit 100 according to the present embodiment includes the quartz crystal resonator 10 and the temperature detection unit 20 laminated on the quartz crystal resonator 10. The temperature detection unit 20 includes the semiconductor layer 21 laminated on the quartz crystal resonator 10 and the first measurement electrode 24c and the second measurement electrode 24d forming a pair of measurement electrodes for measuring a resistance value based on the temperature of the quartz crystal resonator 10 through the semiconductor layer 21.

According to this configuration, a heat transfer area between a semiconductor layer and a quartz crystal resonator is increased compared to the configuration in which a semiconductor layer whose resistance value changes with temperature and is measured and a quartz crystal resonator are connected with a conductive holding member therebetween. Therefore, the rate of heat transfer from the quartz crystal resonator to the semiconductor layer is improved, and the temperature difference between the semiconductor layer and the quartz crystal resonator is reduced. Therefore, the temperature of the quartz crystal resonator can be more accurately measured. Accordingly, a quartz crystal resonator unit is provided that is configured to output a frequency clock with narrow tolerance accuracy.

What is measured by a pair of measurement electrodes is a signal measured through the semiconductor layer and is not limited to a resistance value as long as a signal changes based on the temperature of the quartz crystal resonator. The pair of measurement electrodes may measure, for example, inductance or capacitance, as described above.

Further, in the quartz crystal resonator unit 100 according to the present embodiment, the semiconductor layer 21 is provided so as to not be in contact with the first excitation electrode 14a and the second excitation electrode 14b constituting the pair of excitation electrodes.

According to this configuration, inhibition of the vibration of the quartz crystal resonator by the semiconductor layer is reduced, and deterioration of vibration characteristics of the quartz crystal resonator is suppressed.

In addition, the first measurement electrode 24c and the second measurement electrode 24d are located farther away from the first excitation electrode 14a and the second excitation electrode 14b than the first connection electrode 16a and the second connection electrode 16b are. According to this configuration, parasitic capacitance can be reduced between a pair of connection electrodes connecting a pair of excitation electrodes and the pair of measurement electrodes, and parasitic capacitance can be reduced between the pair of extended electrodes and the pair of measurement electrodes.

Hereinafter, configurations of a quartz crystal resonator unit according to additional exemplary embodiments of the present invention will be described. Note that, in the following embodiments, description of matters common to the first embodiment described above will be omitted, and only different points will be described. In particular, similar operation and effects by a similar configuration will not be described one by one.

Second Exemplary Embodiment

Figure 4:
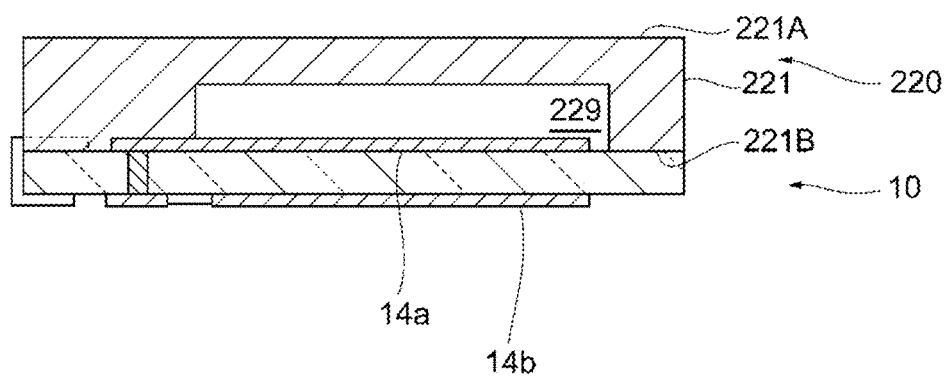
FIG. 4 is a sectional view schematically illustrating a configuration of a laminated structure according to a second exemplary embodiment.

A laminated structure 201 according to a second embodiment will be described with reference to FIG. 4. FIG. 4 is a sectional view schematically illustrating a configuration of a laminated structure according to the second embodiment.

The laminated structure 201 according to the second embodiment is different from the laminated structure 101 according to the first embodiment in that a bottomed recess 229 is formed in a semiconductor layer 221 instead of the through hole. The recess 229 has a cavity on a lower surface 221B side of a semiconductor layer 221 and has a bottom on an upper surface 221A side. That is, the semiconductor layer 220 is provided so as to be in non-contact with the first excitation electrode 14a and the second excitation electrode 14b forming the pair of excitation electrodes.

Also in this embodiment, inhibition of the vibration of a quartz crystal resonator by a semiconductor layer is reduced, and deterioration of vibration characteristics of the quartz crystal resonator is suppressed.

Third Exemplary Embodiment

Figure 5:
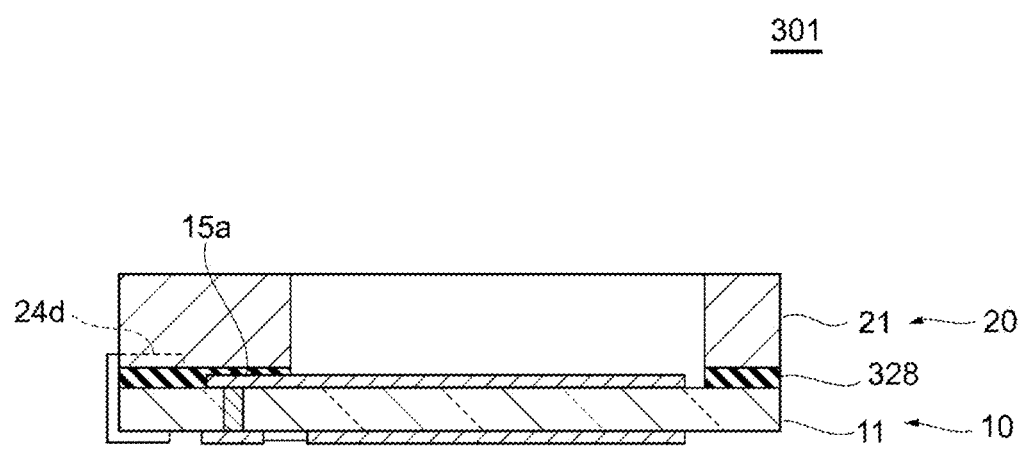
FIG. 5 is a sectional view schematically illustrating a configuration of a laminated structure according to a third exemplary embodiment.

A laminated structure 301 according to a third embodiment will be described with reference to FIG. 5. FIG. 5 is a sectional view schematically illustrating a configuration of a laminated structure according to the third embodiment.

The laminated structure 301 according to the third embodiment is different from the laminated structure 101 according to the first embodiment in that an insulator layer 328 is provided between the quartz crystal resonator 10 and the semiconductor layer 21. The second measurement electrode 24d is provided between the insulator layer 328 and the semiconductor layer 21, and the first extended electrode 15a is provided between the quartz crystal element 11 and the insulator layer 328. That is, the insulation/isolation between the first extended electrode 15a and the second measurement electrode 24d is improved by the insulator layer 328. Although not illustrated in the drawings, the insulation/isolation between the first extended electrode 15a and the first measurement electrode 24c is similarly improved.

According to this configuration, signal leakage from an excitation electrode to a measurement electrode is suppressed, and deterioration of vibration characteristics of a quartz crystal resonator is suppressed.

Fourth Exemplary Embodiment

Figure 6:
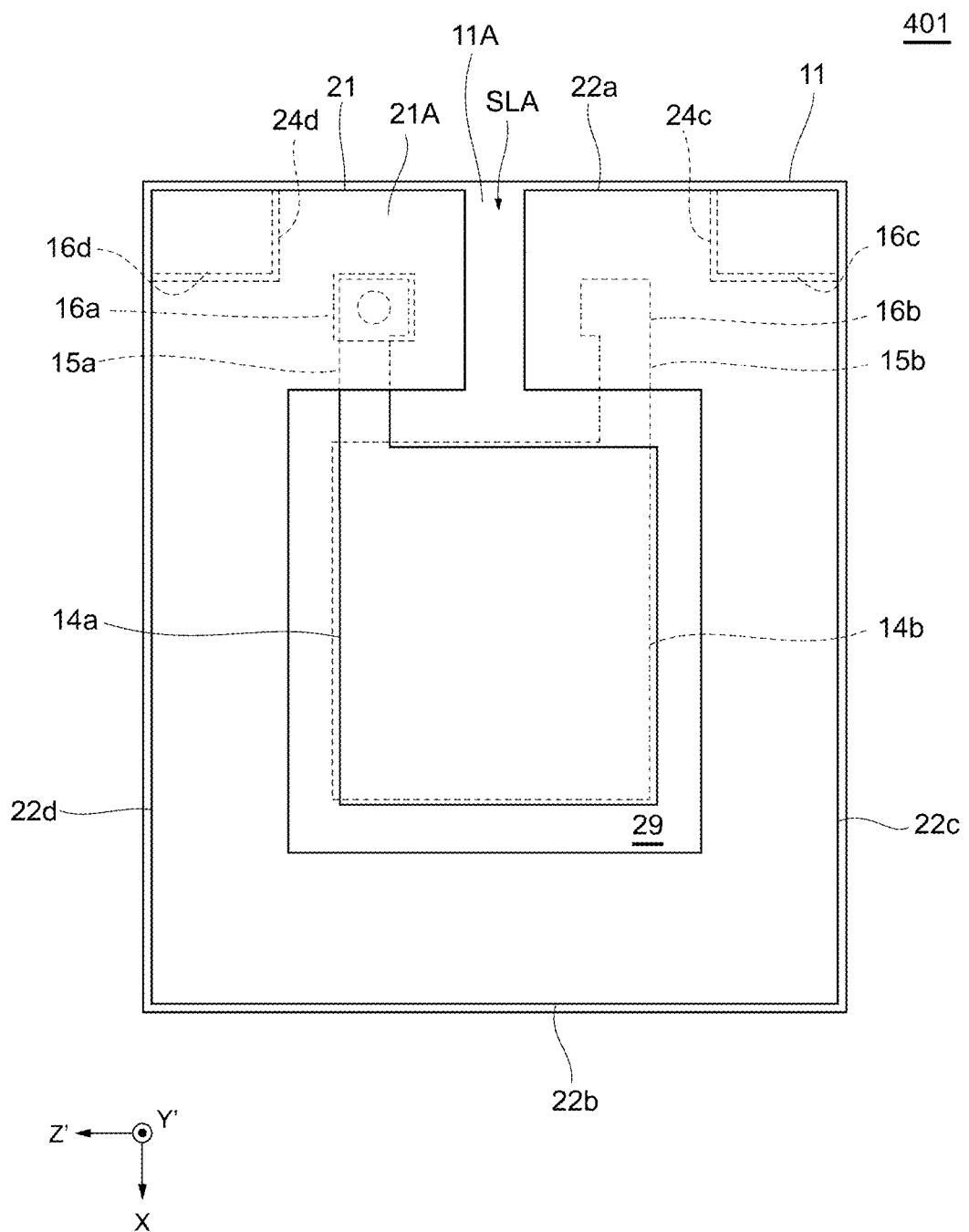
FIG. 6 is a plan view schematically illustrating a configuration of a laminated structure according to a fourth exemplary embodiment.

A laminated structure 401 according to a fourth embodiment will be described with reference to FIG. 6. FIG. 6 is a plan view schematically illustrating a configuration of a laminated structure according to the fourth embodiment. In FIG. 6, for the purpose of making it easy to distinguish the quartz crystal resonator and the temperature detection unit, the temperature detection unit is depicted inside the quartz crystal resonator, but this illustration is not intended to indicate that the external dimensions of the quartz crystal resonator and the temperature detection unit are different from each other. Similarly to the first embodiment, it is assumed that when viewed in the plan view in the +Y'-axis direction, an outer edge portion of the temperature detection unit overlaps an outer edge portion of the quartz crystal resonator in the case where a slit SLA to be described below and the through hole 29 described above are ignored. The same applies to the depiction of the quartz crystal resonator and the temperature detection unit in FIGS. 7 to 9.

The laminated structure 401 according to the fourth embodiment is different from the laminated structure 101 according to the first embodiment in that the slit SLA is formed in the semiconductor layer 21.

The slit SLA is open on both side surfaces on a through hole 29 side and the outer side of a front end portion 22a, and exposes the upper surface 11A of the quartz crystal element 11. The slit SLA makes the semiconductor layer 21, which has a frame shape, discontinuous in the circumferential direction when the upper surface 21A of the semiconductor layer 21 is viewed in the plan view. To be specific, when the upper surface 21A of the semiconductor layer 21 is viewed in the plan view, the slit SLA is provided between the first extended electrode 15a and the second extended electrode 15b, between the first connection electrode 16a and the second connection electrode 16b, between the first measurement electrode 24c and the second measurement electrode 24d, and between the third connection electrode 16c and the fourth connection electrode 16d. In other words, the semiconductor layer 21 is discontinuous in the shortest distance connecting the first measurement electrode 24c and the second measurement electrode 24d constituting the pair of measurement electrodes.

Accordingly, a conductive path of a semiconductor layer functioning as a resistance element is formed so as to go around a first excitation electrode and a second excitation electrode along a right end portion, a rear end portion, and a left end portion. Compared to the configuration that a semiconductor layer is continuous in the shortest distance connecting between a pair of measurement electrodes, the path length of the semiconductor layer as a resistance element is increased according to the present embodiment, and thus the measurement accuracy of the change in the resistance value of the semiconductor layer is improved. Therefore, the accuracy of temperature measurement of a quartz crystal resonator is improved.

Fifth Exemplary Embodiment

Figure 7:
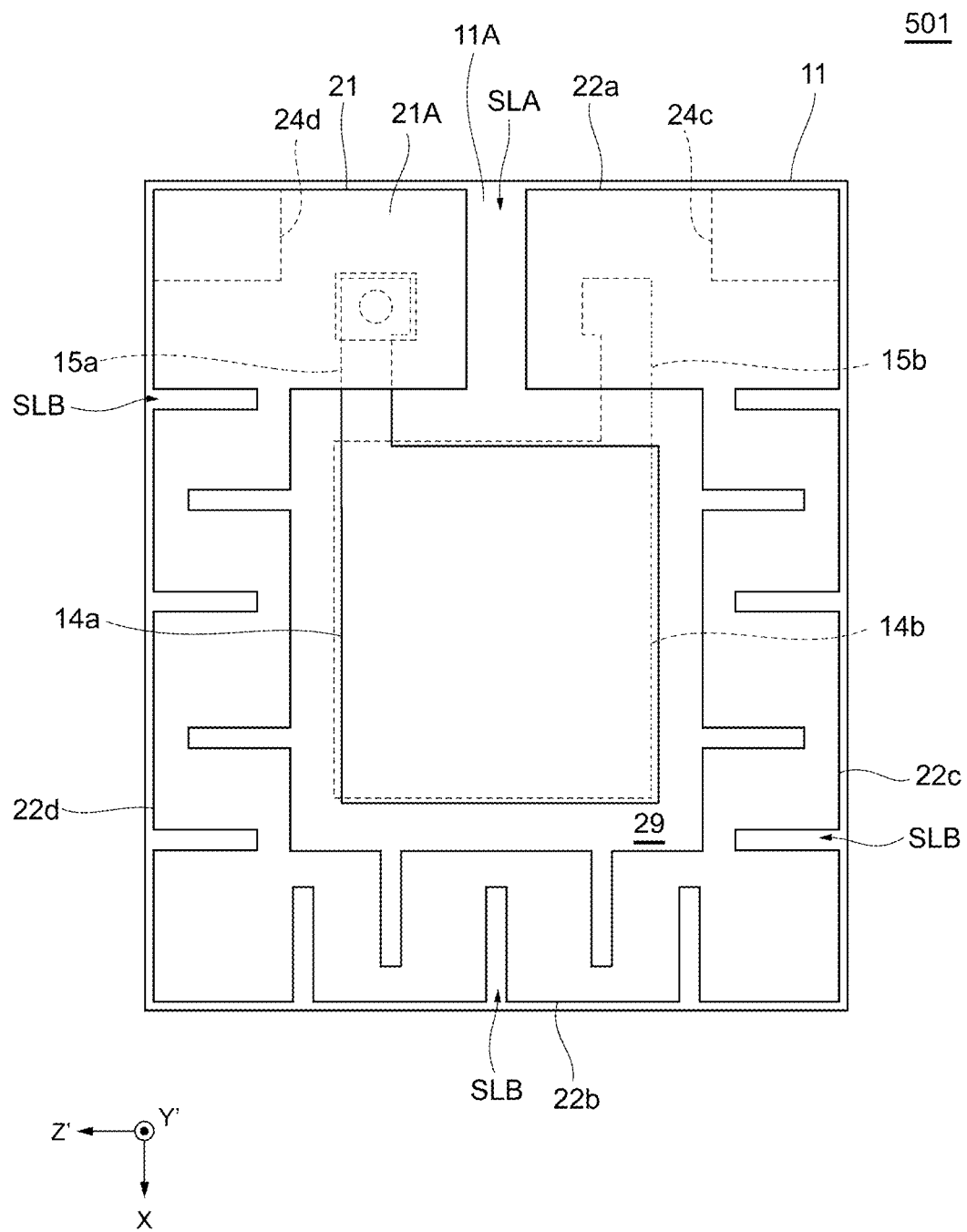
FIG. 7 is a plan view schematically illustrating a configuration of a laminated structure according to a fifth exemplary embodiment.

A laminated structure 501 according to a fifth embodiment will be described with reference to FIG. 7. FIG. 7 is a plan view schematically illustrating a configuration of a laminated structure according to the fifth embodiment.

The laminated structure 501 according to the fifth embodiment is different from the laminated structure 401 according to the fourth embodiment in that a plurality of slits SLB is formed in the semiconductor layer 21.

When the upper surface 21A of the semiconductor layer 21 is viewed in the plan view, the plurality of slits SLB exposes the upper surface 11A of the quartz crystal element 11. In addition, the plurality of slits SLB is open to one side surface of the through hole 29 side or the outer side of the left end portion 22d on the left end portion 22d side with respect to the through hole 29. Similarly, the plurality of slits SLB is open to one side surface of the through hole 29 side or the outer side of the rear end portion 22b on the rear end portion 22b side with respect to the through hole 29, and open to one side surface of the through hole 29 side or the outer side of the right end portion 22c on the right end portion 22c side with respect to the through hole 29.

Accordingly, since the path length of a semiconductor layer as a resistance element is increased, the measurement accuracy of the change in a resistance value of the semiconductor layer is improved. Therefore, the accuracy of temperature measurement of a quartz crystal resonator is improved.

Sixth Exemplary Embodiment

Figure 8:
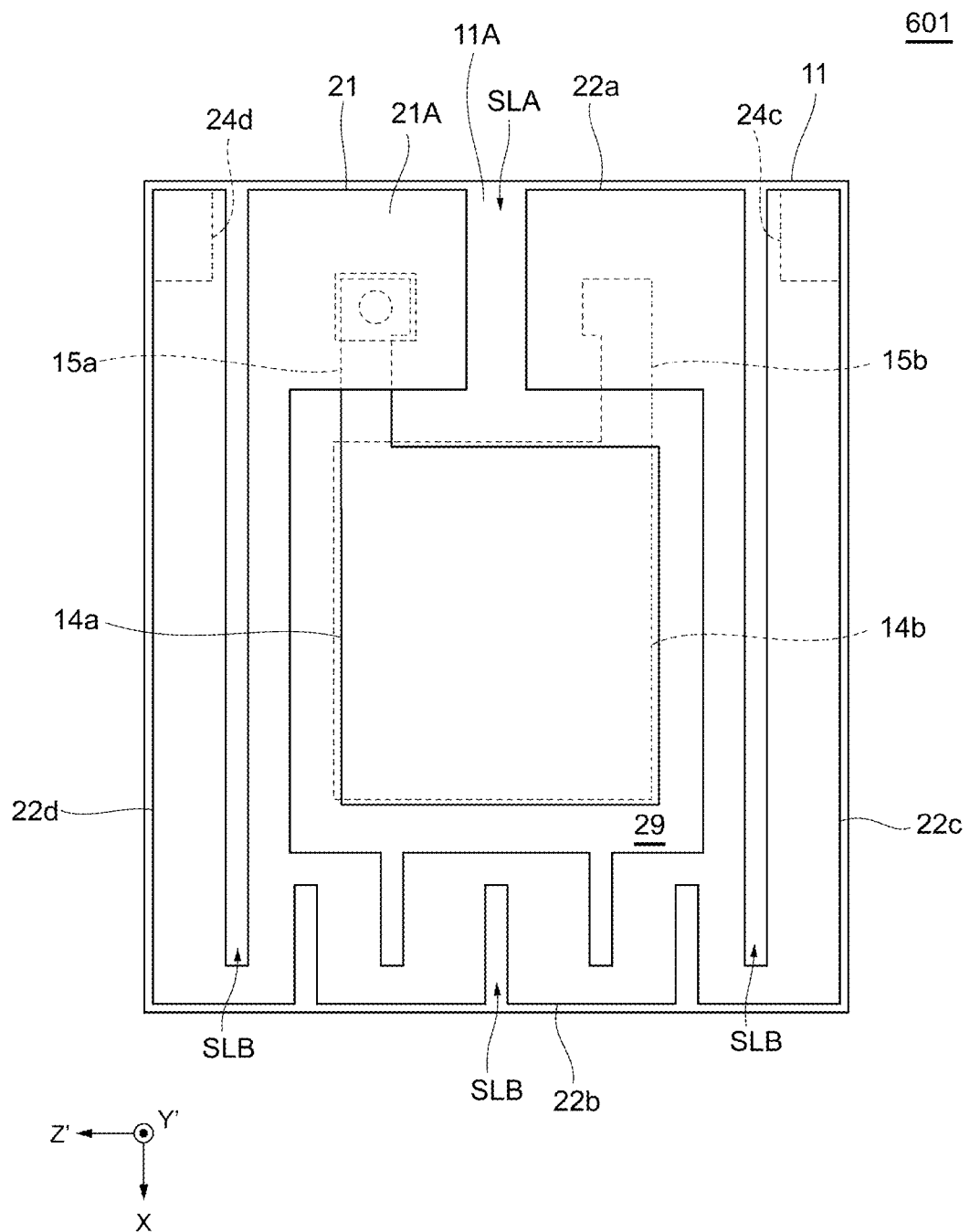
FIG. 8 is a plan view schematically illustrating a configuration of a laminated structure according to a sixth exemplary embodiment.

A laminated structure 601 according to a sixth embodiment will be described with reference to FIG. 8. FIG. 8 is a plan view schematically illustrating a configuration of a laminated structure according to the sixth embodiment.

The laminated structure 601 according to the sixth embodiment is different from the laminated structure 501 according to the fifth embodiment in that a plurality of slits SLB is formed along the X-axis direction.

When the upper surface 21A of the semiconductor layer 21 is viewed in the plan view, the plurality of slits SLB is open to one side surface of the outer side of the front end portion 22a or the rear end portion 22b on the left end portion 22d side with respect to the through hole 29. In addition, the plurality of slits SLB is open to one side surface of the outer side of the front end portion 22a or the rear end portion 22b on the right end portion 22c side with respect to the through hole 29. On the rear end portion 22b side with respect to the through hole 29, the plurality of slits SLB has the same configuration as in the fifth embodiment.

Also in the present embodiment, the same effects as those of the fifth embodiment can be obtained. As long as the path length of a semiconductor layer as a resistance element is increased, the shapes of the plurality of slits are not limited to those in the fifth embodiment and the sixth embodiment. For example, each of the plurality of slits may be formed along the Z'-axis direction, or at least part of the plurality of slits may be bent.

Seventh Exemplary Embodiment

Figure 9:
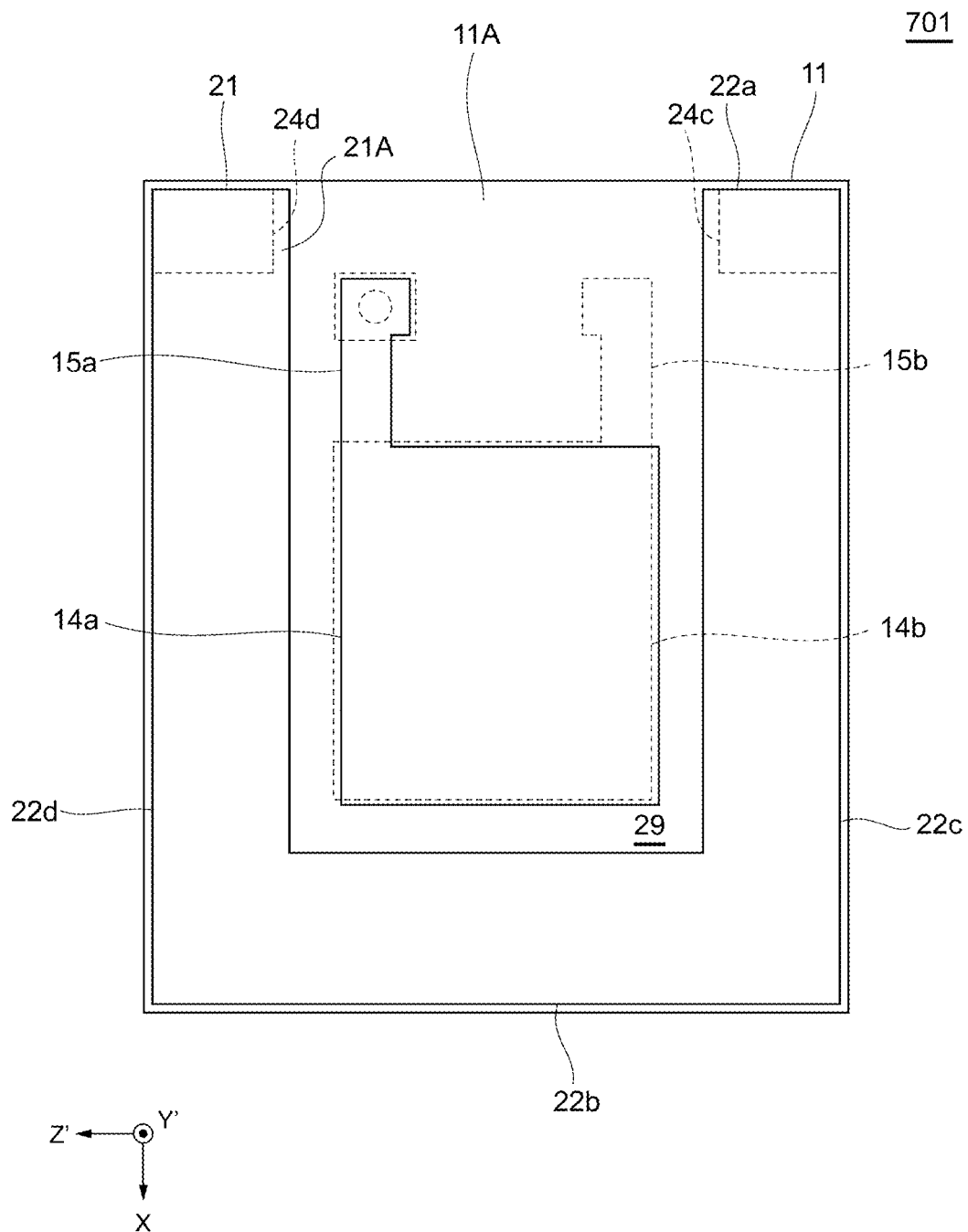
FIG. 9 is a plan view schematically illustrating a configuration of a laminated structure according to a seventh exemplary embodiment.

A laminated structure 701 according to a seventh embodiment will be described with reference to FIG. 9. FIG. 9 is a plan view schematically illustrating a configuration of a laminated structure according to the seventh embodiment.

The laminated structure 701 according to the seventh embodiment is different from the laminated structure 401 according to the fourth embodiment in that the semiconductor layer 21 is formed in a U-shape.

When the upper surface 21A of the semiconductor layer 21 is viewed in the plan view, the semiconductor layer 21 is provided along the right end portion 22c, the rear end portion 22b, and the left end portion 22d. In addition, the semiconductor layer 21 is provided at outer side portions of an electrode group of the quartz crystal resonator 10 so as to avoid the electrode group of the first excitation electrode 14a and the second excitation electrode 14b, the first extended electrode 15a and the second extended electrode 15b, and the first connection electrode 16a and the second connection electrode 16b. Therefore, the insulation/isolation between the first extended electrode 15a and the first measurement electrode 24c and the insulation/isolation between the first extended electrode 15a and the second measurement electrode 24d are improved.

Accordingly, the path length of a semiconductor layer as a resistance element is increased, and signal leakage from an excitation electrode to a measurement electrode is suppressed. Therefore, the accuracy of temperature measurement of a quartz crystal resonator is improved, and deterioration of vibration characteristics of the quartz crystal resonator is suppressed.

Eighth Exemplary Embodiment

Figure 10:
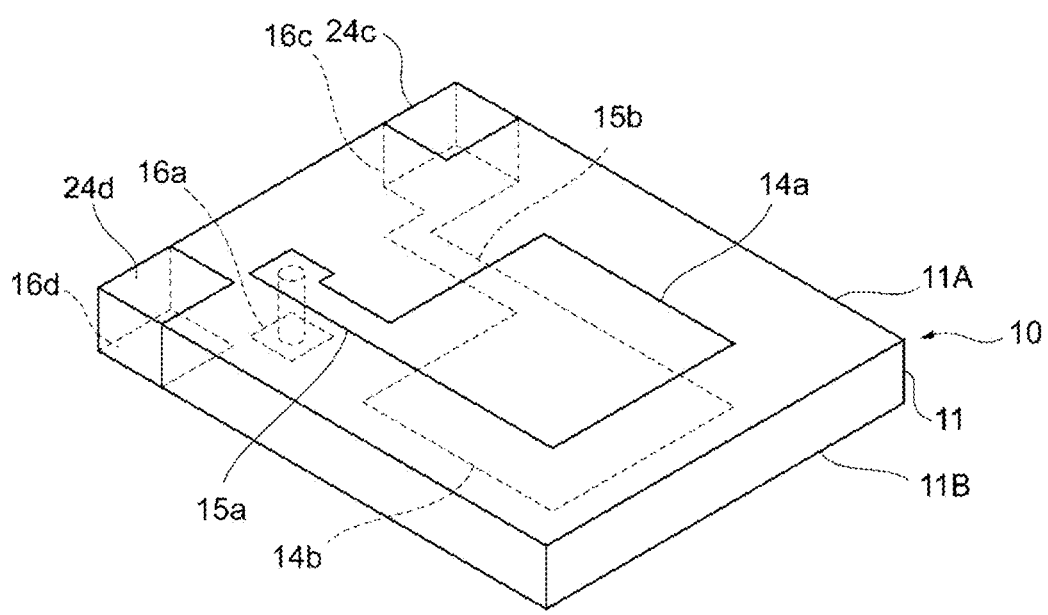
FIG. 10 is a perspective view schematically illustrating a configuration of a quartz crystal resonator unit according to an eighth exemplary embodiment.

A quartz crystal resonator 810 according to an eighth embodiment will be described with reference to FIG. 10. FIG. 10 is a perspective view schematically illustrating a configuration of a quartz crystal resonator according to the eighth embodiment.

The quartz crystal resonator 810 according to the eighth embodiment is different from the quartz crystal resonator 10 according to the first embodiment in that the second connection electrode is omitted and the second extended electrode 15b electrically connects the second excitation electrode 14b and the third connection electrode 16c.

The first measurement electrode 24c is electrically connected to the second excitation electrode 14b. Although not illustrated, the laminated structure according to the eighth embodiment is mounted on the base member with the first conductive holding member 36a, the third conductive holding member 36c, and the fourth conductive holding member 36d. The third connection electrode 16c serves as an input terminal for driving vibration to the second excitation electrode 14b and also serves as an input terminal for a measurement signal to the first measurement electrode 24c. In other words, in the temperature detection mode, the measurement signal based on the temperature of the quartz crystal resonator 810 are measured through the third connection electrode 16c and the fourth connection electrode 16d through the semiconductor layer 21. In addition, in the signal output mode, a drive signal for driving the quartz crystal resonator 10 is input to the third connection electrode 16c and the fourth connection electrode 16d, and the frequency of the oscillation circuit based on the quartz crystal resonator 10 is corrected by temperature compensation based on measurement results in the temperature detection mode.

Ninth Exemplary Embodiment

A quartz crystal resonator 910 according to a ninth embodiment will be described with reference to FIG. 11.

Figure 11:
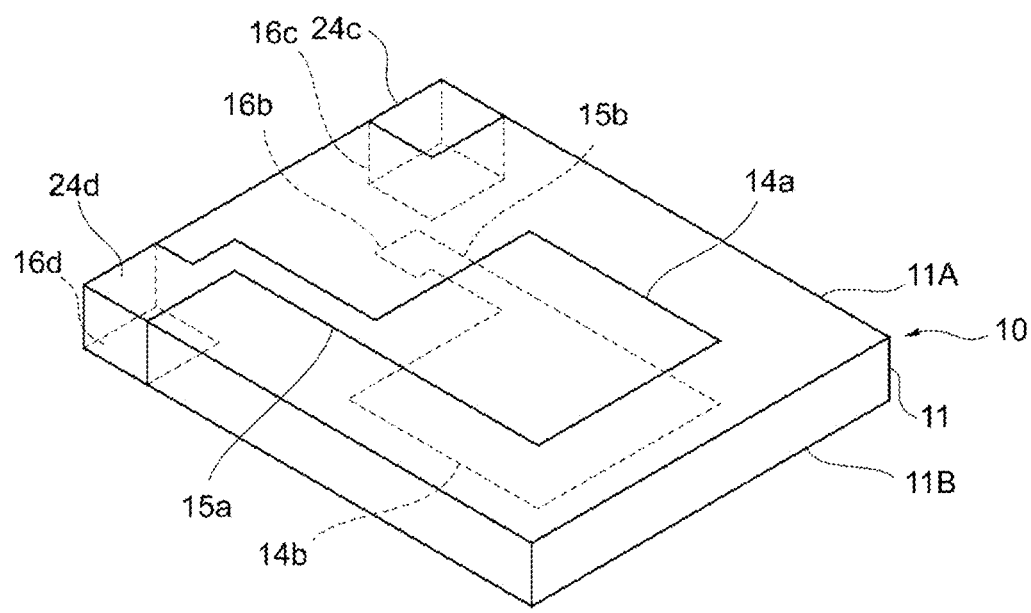
FIG. 11 is a perspective view schematically illustrating a configuration of a quartz crystal resonator unit according to a ninth exemplary embodiment.
Figure 11:
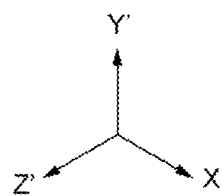

FIG. 11 is a perspective view schematically illustrating a configuration of a quartz crystal resonator according to the ninth embodiment.

The quartz crystal resonator 910 according to the ninth embodiment is different from the quartz crystal resonator 10 according to the first embodiment in that the first connection electrode is omitted and the first extended electrode 15a electrically connects the first excitation electrode 14a and the fourth connection electrode 16d.

The second measurement electrode 24d is electrically connected to the first excitation electrode 14a. Although not illustrated, the laminated structure according to the ninth embodiment is mounted on the base member with the second conductive holding member 36b, the third conductive holding member 36c, and the fourth conductive holding member 36d. The fourth connection electrode 16d serves as an input terminal for driving vibration to the first excitation electrode 14a and also serves as an input terminal for the measurement signal to the second measurement electrode 24d.

Tenth Exemplary Embodiment

Figure 12:
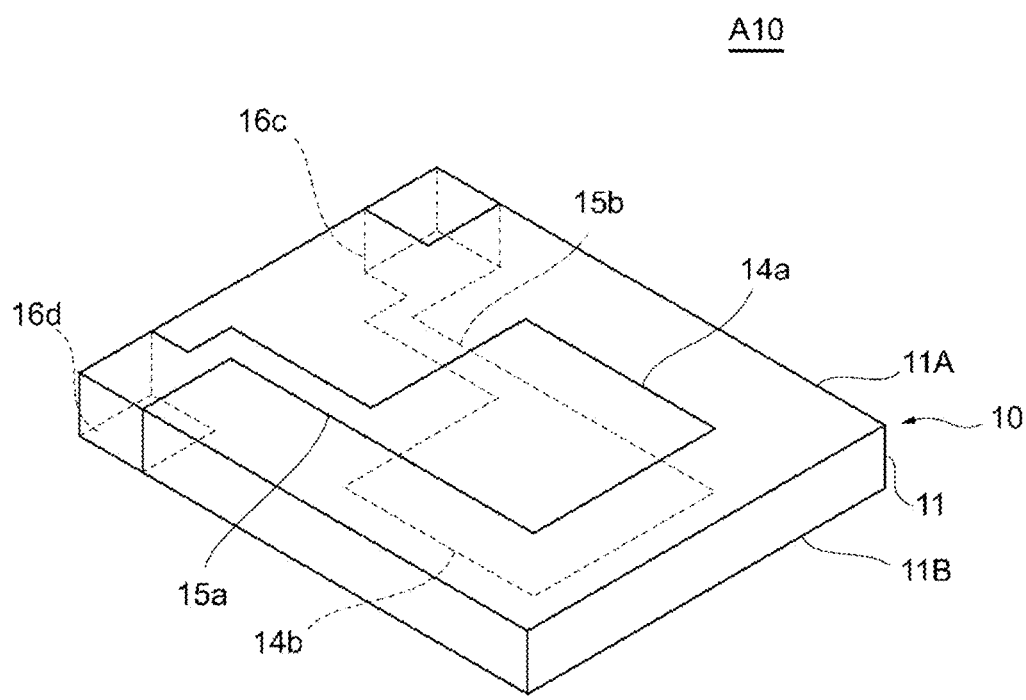
FIG. 12 is a perspective view schematically illustrating a configuration of a quartz crystal resonator unit according to a tenth exemplary embodiment.
Figure 12:
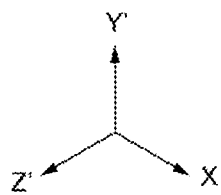

A quartz crystal resonator A10 according to a tenth embodiment will be described with reference to FIG. 12. FIG. 12 is a perspective view schematically illustrating a configuration of a quartz crystal resonator according to the tenth embodiment.

The quartz crystal resonator A10 according to the tenth embodiment is different from the quartz crystal resonator 10 according to the first embodiment in that the first connection electrode and the second connection electrode are omitted, the second extended electrode 15b electrically connects the second excitation electrode 14b and the third connection electrode 16c, and the first extended electrode 15a electrically connects the first excitation electrode 14a and the fourth connection electrode 16d.

As illustrated in the eighth to tenth embodiments, at least one of the pair of measurement electrodes may be electrically connected to one of the pair of excitation electrodes.

Eleventh Exemplary Embodiment

Figure 13:
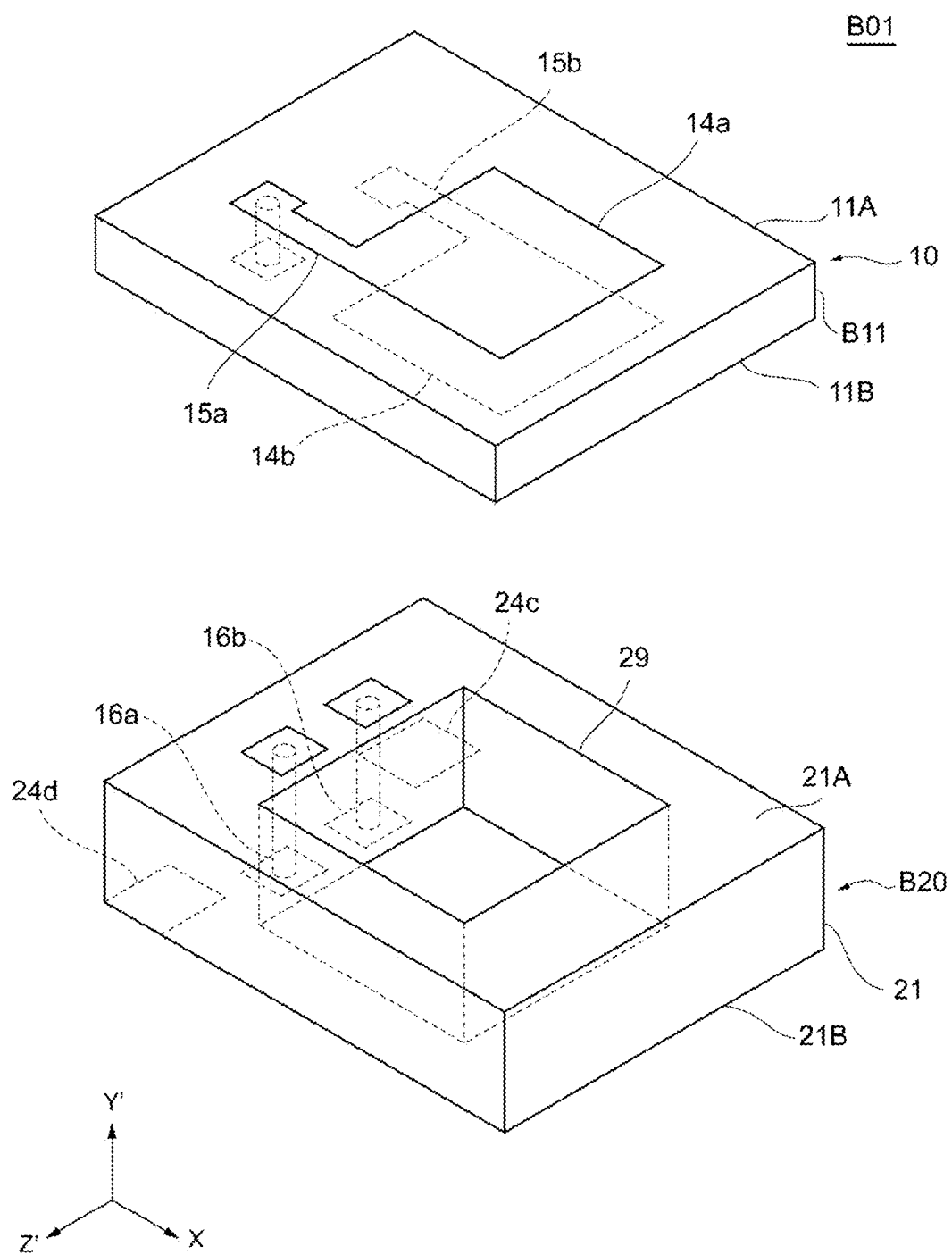
FIG. 13 is a perspective view schematically illustrating a configuration of a laminated structure according to an eleventh exemplary embodiment.

A laminated structure B01 according to an eleventh embodiment will be described with reference to FIG. 13. FIG. 13 is an exploded perspective view schematically illustrating a configuration of a laminated structure according to the eleventh embodiment.

As shown, the laminated structure B01 according to the eleventh embodiment is different from the laminated structure 101 according to the first embodiment in that a temperature detection unit B20 is laminated on the base member side of a quartz crystal resonator B10.

The quartz crystal resonator B10 and the temperature detection unit B20 are laminated such that the lower surface 11B of the quartz crystal element 11 and the upper surface 21A of the semiconductor layer 21 face each other. The first extended electrode 15a and the second extended are electrically connected to a first connection electrode 16a and a second connection electrode 16b provided on the lower surface 21B of the semiconductor layer 21 via a through electrode penetrating the semiconductor layer 21 from the upper surface 21A to the lower surface 21B, respectively. The first measurement electrode 24c and the second measurement electrode 24d are provided on the lower surface 21B of the semiconductor layer 21 and bonded with the third conductive holding member 36c and the fourth conductive holding member 36d (not illustrated), respectively.

Twelfth Exemplary Embodiment

Figure 14:
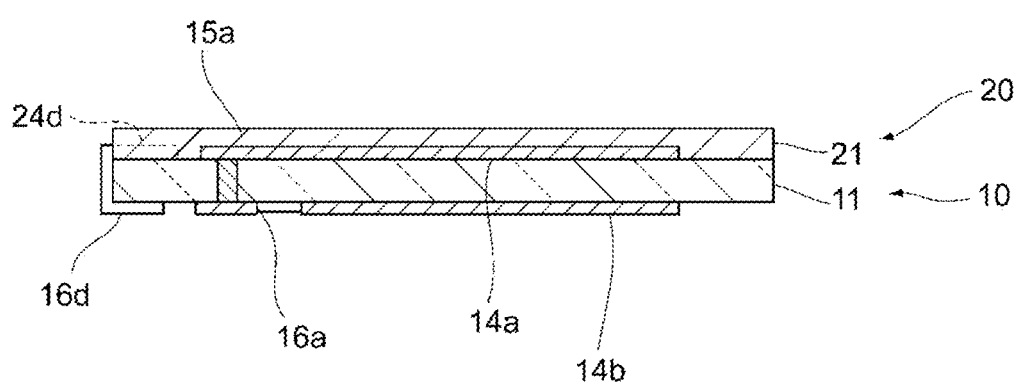
FIG. 14 is a sectional view schematically illustrating a configuration of a laminated structure according to a twelfth exemplary embodiment.

A laminated structure C01 according to a twelfth embodiment will be described with reference to FIG. 14. FIG. 14 is a sectional view schematically illustrating a configuration of a laminated structure according to the twelfth embodiment.

The laminated structure B01 according to the twelfth embodiment is different from the laminated structure 101 according to the first embodiment in that the semiconductor layer 21 is in contact with the first excitation electrode 14a.

It is desirable that the semiconductor layer 21 be thinner than the semiconductor layer 21 according to the first embodiment in order not to inhibit the vibration of the quartz crystal resonator 10.

Accordingly, since a heat transfer area between a semiconductor layer and a quartz crystal resonator is increased, the temperature of the quartz crystal resonator can be measured more accurately.

Thirteenth Exemplary Embodiment

Figure 15:
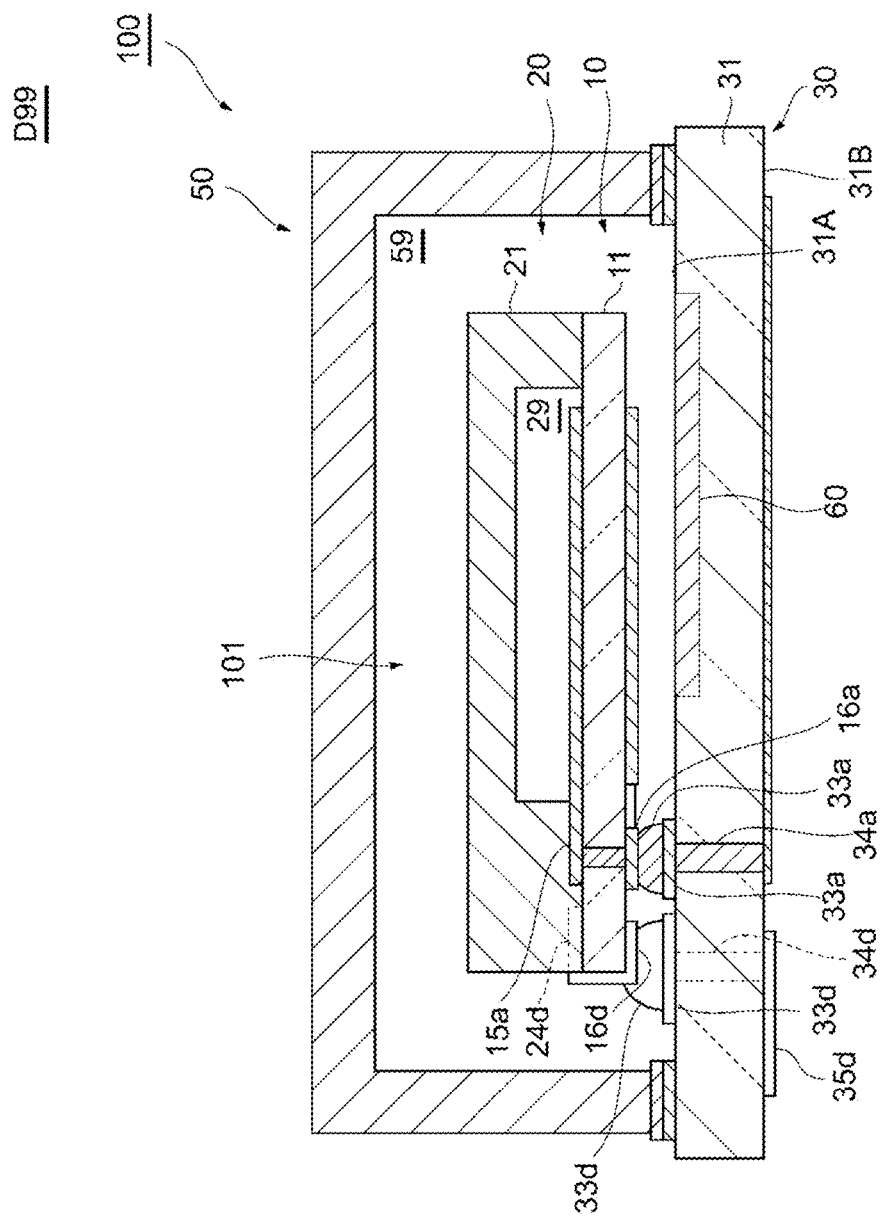
FIG. 15 is a sectional view schematically illustrating a configuration of an oscillator according to a thirteenth exemplary embodiment.

An oscillator D99 according to a thirteenth embodiment will be described with reference to FIG. 15. FIG. 15 is a sectional view schematically illustrating a configuration of an oscillator according to the thirteenth embodiment.

The oscillator D99 further includes a semiconductor integrated circuit 60 in addition to the quartz crystal resonator unit 100. The semiconductor integrated circuit 60 is formed on the upper surface 31A of the base body 31. The semiconductor integrated circuit 60 includes, for example, an oscillation circuit that oscillates the quartz crystal resonator 10, a measurement circuit that measures temperature of the semiconductor layer 21 based on the resistance value of the semiconductor layer 21 as the temperature of the quartz crystal resonator 10, a temperature compensation circuit that corrects the frequency of the oscillation circuit based on the quartz crystal resonator 10 by temperature compensation based on the measurement result of the measurement circuit, a ROM circuit that stores parameters for temperature compensation, and a voltage generation circuit that provides power necessary for each circuit.

In an exemplary aspect, the semiconductor integrated circuits 60 may be formed on the lower surface 31B of the base body 31 or may be formed outside the quartz crystal resonator unit 100.

In the following description, some or all of the embodiments of the present invention will be added and effects thereof will be described. It is noted that the exemplary embodiments of the present invention are not limited to the following supplementary notes.

According to an aspect of the present invention, there is provided a base member, a cover member and a laminated structure provided between the base member and the cover member. The laminated structure includes a piezoelectric resonator including a piezoelectric layer having a pair of principal surfaces facing each other and a pair of excitation electrodes each provided on corresponding one of the pair of principal surfaces of the piezoelectric layer so as to face each other with the piezoelectric layer therebetween, a semiconductor layer laminated on a side of one of the pair of principal surfaces of the piezoelectric layer of the piezoelectric resonator, and a pair of measurement electrodes provided on the semiconductor layer. The pair of measurement electrodes is configured to measure a signal based on temperature of the piezoelectric resonator through the semiconductor layer.

In one aspect, the pair of measurement electrodes measures a resistance value of the semiconductor layer.

According to this configuration, a heat transfer area can be increased between the semiconductor layer and the quartz crystal resonator compared to the configuration in which the semiconductor layer whose resistance value changes with temperature and is measured and the quartz crystal resonator are connected with the conductive holding member therebetween. Therefore, the rate of heat transfer from the quartz crystal resonator to the semiconductor layer is improved, and the temperature difference between the semiconductor layer and the quartz crystal resonator is reduced. Therefore, the temperature of the quartz crystal resonator can be more accurately measured. Accordingly, a quartz crystal resonator unit can be provided that is constructed for outputting a frequency clock with narrow tolerance accuracy.

In one aspect, the laminated structure further includes an insulator layer provided between the piezoelectric layer and the semiconductor layer.

According to this configuration, signal leakage from the excitation electrode to the measurement electrode is suppressed, and deterioration of vibration characteristics of the quartz crystal resonator is suppressed.

In one aspect, the semiconductor layer is provided so as to not be in contact with the pair of excitation electrodes.

According to this configuration, inhibition of the vibration of the quartz crystal resonator by the semiconductor layer is reduced, and deterioration of vibration characteristics of the quartz crystal resonator is suppressed.

In one aspect, the semiconductor layer is discontinuous in the shortest distance connecting each of the pair of measurement electrodes when the piezoelectric resonator is viewed in the plan view.

According to this configuration, since the path length of the semiconductor layer as the resistance element increases compared to the configuration in which the semiconductor layer is continuous in the shortest distance between the pair of measurement electrodes, the measurement accuracy of the change in the resistance value of the semiconductor layer is improved. Therefore, the accuracy of temperature measurement of the quartz crystal resonator is improved.

In one aspect, a plurality of slits is formed in the semiconductor layer.

In one aspect, the piezoelectric resonator further includes a pair of connection electrodes electrically connected to the pair of excitation electrodes via extended electrodes, and when the pair of principal surfaces of the piezoelectric layer of the piezoelectric resonator is viewed in the plan view, the pair of measurement electrodes is farther away from the pair of excitation electrodes than the pair of connection electrodes.

According to this configuration, parasitic capacitance can be reduced between the pair of connection electrodes connecting the pair of excitation electrodes and the pair of measurement electrodes, and parasitic capacitance can be reduced between the pair of extended electrodes and the pair of measurement electrodes.

In one aspect, at least one of the pair of measurement electrodes is electrically connected to one of the pair of excitation electrodes.

In one aspect, there is provided an oscillator further including a measurement circuit that measures, based on the signal acquired through the semiconductor layer by the pair of measurement electrodes, temperature of the piezoelectric resonator.

In one aspect, a temperature compensation circuit that compensates a frequency of the piezoelectric resonator in response to the measurement circuit is further provided.

As described above, according to one exemplary aspect, a piezoelectric resonator unit is provided in which temperature compensation accuracy is improved and an oscillator including the piezoelectric resonator unit.

It is noted that the embodiments described above are intended to facilitate understanding of the present invention and are not intended to be construed as limiting the present invention. The present invention can be modified/improved without departing from the gist thereof, and the present invention includes equivalents thereof. That is, the embodiments in which design is appropriately changed by those skilled in the art are also included in the scope of the present invention as long as they have the features of the present invention. For example, each element included in each embodiment and the arrangement, material, condition, shape, size, and the like are not limited to those illustrated and can be changed as appropriate. For example, the resonator and the resonator unit of the present invention can be used in timing devices or load sensors. Further, each element included in each embodiment can be combined as long as it is technically possible, and a combination is also included in the scope of the present invention as long as it includes the feature of the present invention.

REFERENCE SIGNS LIST

100 QUARTZ CRYSTAL RESONATOR UNIT
10 QUARTZ CRYSTAL RESONATOR
11 QUARTZ CRYSTAL ELEMENT
11A UPPER SURFACE OF QUARTZ CRYSTAL ELEMENT
11B LOWER SURFACE OF QUARTZ CRYSTAL ELEMENT
14a FIRST EXCITATION ELECTRODE
14b SECOND EXCITATION ELECTRODE
15a FIRST EXTENDED ELECTRODE
15b SECOND EXTENDED ELECTRODE
16a FIRST CONNECTION ELECTRODE
16b SECOND CONNECTION ELECTRODE
16c THIRD CONNECTION ELECTRODE
16d FOURTH CONNECTION ELECTRODE
20 TEMPERATURE DETECTION UNIT
21 SEMICONDUCTOR LAYER
21A UPPER SURFACE OF SEMICONDUCTOR LAYER
21B LOWER SURFACE OF SEMICONDUCTOR LAYER
22a FRONT END PORTION
22b REAR END PORTION
22c RIGHT END PORTION
22d LEFT END PORTION
24c FIRST MEASUREMENT ELECTRODE
24d SECOND MEASUREMENT ELECTRODE
29 THROUGH HOLE

The invention claimed is:

1. A piezoelectric resonator unit comprising:
a base;
a cover; and
a laminated structure disposed between the base and the cover, and including:
a piezoelectric resonator that includes:
a piezoelectric layer having a pair of principal surfaces, and
a pair of excitation electrodes each disposed on one of the pair of principal surfaces of the piezoelectric layer, respectively, so as to face each other with the piezoelectric layer therebetween,
a semiconductor layer disposed on one of the pair of principal surfaces of the piezoelectric layer, and
a pair of measurement electrodes disposed on the semiconductor layer and configured to measure a signal based on a temperature of the piezoelectric resonator through the semiconductor layer,
wherein the pair of measurement electrodes are configured to measure either an inductance or a capacitance of the semiconductor layer.

2. The piezoelectric resonator unit according to claim 1, wherein the semiconductor layer does not contact the pair of excitation electrodes.

3. The piezoelectric resonator unit according to claim 2, wherein a through hole is disposed in the semiconductor layer, such that the semiconductor layer is constructed to not contact the pair of excitation electrodes.

4. An oscillator comprising:
piezoelectric resonator unit according to claim 1; and
a measurement circuit configured to measure, based on the signal measured by the pair of measurement electrodes, temperature of the piezoelectric resonator.

5. The oscillator according to claim 4, further comprising a temperature compensation circuit configured to compensate a frequency of the piezoelectric resonator based on a measurement result of the measurement circuit.

6. The piezoelectric resonator unit according to claim 1, wherein the piezoelectric resonator further includes a pair of connection electrodes electrically connected to the pair of excitation electrodes via extended electrodes, and, when the pair of principal surfaces of the piezoelectric layer is viewed in a plan view, the pair of measurement electrodes is farther away from the pair of excitation electrodes than the pair of connection electrodes.

7. The piezoelectric resonator unit according to claim 1, wherein at least one of the pair of measurement electrodes is electrically connected to one of the pair of excitation electrodes.

8. The piezoelectric resonator unit according to claim 1, wherein the semiconductor layer is discontinuous in a shortest distance connecting each of the pair of measurement electrodes when the piezoelectric resonator is viewed in a plan view.

9. The piezoelectric resonator unit according to claim 1, further comprising a plurality of slits disposed in the semiconductor layer.

10. A piezoelectric resonator unit comprising:
a base;
a cover; and
a laminated structure disposed between the base and the cover, and including a piezoelectric resonator having:
a piezoelectric layer with a pair of principal surfaces, and
a pair of excitation electrodes each disposed on a respective surface of the pair of principal surfaces, so as to face each other with the piezoelectric layer therebetween,
a semiconductor layer disposed on one surface of the pair of principal surfaces, and
a pair of measurement electrodes configured to measure a signal through the semiconductor layer that changes based on a temperature of the piezoelectric resonator, wherein the laminated structure further includes an insulator layer disposed between the piezoelectric layer and the semiconductor layer.

11. The piezoelectric resonator unit according to claim 10, wherein the semiconductor layer is discontinuous in a shortest distance connecting each of the pair of measurement electrodes when the piezoelectric resonator is viewed in a plan view.

12. The piezoelectric resonator unit according to claim 10, further comprising a plurality of slits disposed in the semiconductor layer.

13. The piezoelectric resonator unit according to claim 10, wherein the pair of measurement electrodes are disposed on the semiconductor layer.

14. The piezoelectric resonator unit according to claim 10, wherein the pair of measurement electrodes are configured to measure one of a resistance value, an inductance and a capacitance of the semiconductor layer.

15. The piezoelectric resonator unit according to claim 10, wherein the semiconductor layer does not contact the pair of excitation electrodes.

16. A piezoelectric resonator unit comprising:
a base;
a cover; and
a laminated structure disposed between the base and the cover, and including:
 a piezoelectric resonator that includes:
  a piezoelectric layer having a pair of principal surfaces, and
  a pair of excitation electrodes each disposed on one of the pair of principal surfaces of the piezoelectric layer, respectively, so as to face each other with the piezoelectric layer therebetween,
 a semiconductor layer disposed on one of the pair of principal surfaces of the piezoelectric layer, and
 a pair of measurement electrodes disposed on the semiconductor layer and configured to measure a signal based on a temperature of the piezoelectric resonator through the semiconductor layer,
 wherein the laminated structure further includes an insulator layer disposed between the piezoelectric layer and the semiconductor layer.

17. The piezoelectric resonator unit according to claim 16, wherein the pair of measurement electrodes are configured to measure a resistance value of the semiconductor layer.

18. The piezoelectric resonator unit according to claim 17, wherein the semiconductor layer is constructed such that the resistance value changes based on the temperature of the piezoelectric resonator.

* * * * *